US011091644B2

(12) United States Patent
Park et al.

(10) Patent No.: US 11,091,644 B2
(45) Date of Patent: Aug. 17, 2021

(54) METHOD FOR PRODUCING COLORANT COMPOSITION, AND COLORANT COMPOSITION, COLORANT DISPERSION, PHOTOSENSITIVE RESIN COMPOSITION, COLOR FILTER, LIQUID CRYSTAL DISPLAY DEVICE PRODUCED USING SAME

(71) Applicant: LG CHEM, LTD., Seoul (KR)

(72) Inventors: Jongho Park, Daejeon (KR); Dami Lee, Daejeon (KR); Sanga Choi, Daejeon (KR); Seung Jin Yang, Daejeon (KR); Sang Gyun Park, Daejeon (KR); Jae Joon Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 186 days.

(21) Appl. No.: 16/485,093

(22) PCT Filed: Jun. 5, 2018

(86) PCT No.: PCT/KR2018/006383
§ 371 (c)(1),
(2) Date: Aug. 9, 2019

(87) PCT Pub. No.: WO2019/107685
PCT Pub. Date: Jun. 6, 2019

(65) Prior Publication Data
US 2020/0040188 A1  Feb. 6, 2020

(30) Foreign Application Priority Data
Nov. 28, 2017  (KR) .................. 10-2017-0160329

(51) Int. Cl.
| C09B 11/28 | (2006.01) |
| G03F 7/033 | (2006.01) |
| G02B 5/20 | (2006.01) |
| G02F 1/1335 | (2006.01) |
| G03F 7/00 | (2006.01) |

(52) U.S. Cl.
CPC .............. C09B 11/28 (2013.01); G02B 5/201 (2013.01); G02F 1/133514 (2013.01); G03F 7/0007 (2013.01); G03F 7/033 (2013.01)

(58) Field of Classification Search
CPC ........ G03F 7/0007; G03F 7/027; G03F 7/028; G03F 7/033; G03F 7/105; G02B 5/201; G02B 5/223; G02F 1/133514; G02F 1/133516; C09B 11/28; C09B 67/008
USPC .................................................. 430/7, 281.1
See application file for complete search history.

(56) References Cited

U.S. PATENT DOCUMENTS

| 3,751,279 A * | 8/1973 | Papenfuss ........... C09B 67/0061 106/463 |
| 7,939,644 B2 | 5/2011 | Ignatyev et al. |
| 9,376,571 B2 | 6/2016 | Okada et al. |
| 9,481,694 B2 | 11/2016 | Maekawa et al. |
| 10,216,083 B2 | 2/2019 | Wei et al. |
| 2008/0048155 A1 | 2/2008 | Toriniwa et al. |
| 2010/0261103 A1* | 10/2010 | Sasaki ................. C09B 67/0005 430/7 |
| 2014/0125930 A1 | 5/2014 | Sawada |
| 2015/0322265 A1 | 11/2015 | Park et al. |
| 2015/0368473 A1 | 12/2015 | Okada et al. |
| 2016/0154303 A1* | 6/2016 | Itou ........................ C09B 69/06 252/586 |

FOREIGN PATENT DOCUMENTS

| CN | 101634725 A | 1/2010 |
| CN | 102736416 A | 10/2012 |
| CN | 103502363 A | 1/2014 |
| JP | 2005-111696 A | 4/2005 |
| JP | 2005-335662 A | 12/2005 |
| JP | 2006-003080 A | 1/2006 |
| JP | 2006-248180 A | 9/2006 |
| JP | 2007-182507 A | 7/2007 |
| JP | 2010-079142 A | 4/2010 |
| JP | 2011-59673 A | 3/2011 |
| JP | 2013-213161 A | 10/2013 |
| JP | 2014-152274 A | 8/2014 |
| JP | 2014-199436 A | 10/2014 |
| JP | 2016-053153 A | 4/2016 |
| JP | 2016-075845 A | 5/2016 |
| JP | 2016-094593 A | 5/2016 |
| KR | 10-2007-0041718 A | 4/2007 |
| KR | 10-2010-0088095 A | 8/2010 |
| KR | 10-2013-0094746 A | 8/2013 |
| KR | 10-2013-0111023 A | 10/2013 |
| KR | 10-2013-0140611 A | 12/2013 |
| KR | 10-2014-0082764 A | 7/2014 |
| KR | 10-2015-0115719 A | 10/2015 |
| KR | 10-2015-0116441 A | 10/2015 |
| KR | 10-2015-0132005 A | 11/2015 |
| KR | 10-2017-0129744 A | 11/2017 |

* cited by examiner

OTHER PUBLICATIONS

International Search Report and Written Opinion issued for International Application No. PCT/KR2018/006383, dated Feb. 8, 2019.

*Primary Examiner* — John A McPherson
(74) *Attorney, Agent, or Firm* — Rothwell, Figg, Ernst & Manbeck, P.C.

(57) ABSTRACT

The present specification relates to a method for preparing a colorant composition comprising dissolving a first xanthene-based dye having the same number of positive charges and negative charges and a second xanthene-based dye having more negative charges than positive charges by one or more in a first solvent; and precipitating the dissolved first xanthene-based dye and the dissolved second xanthene-based dye in a second solvent, and a colorant composition, a colorant dispersion, a photosensitive resin composition, a color filter and a liquid crystal display device.

20 Claims, No Drawings

METHOD FOR PRODUCING COLORANT COMPOSITION, AND COLORANT COMPOSITION, COLORANT DISPERSION, PHOTOSENSITIVE RESIN COMPOSITION, COLOR FILTER, LIQUID CRYSTAL DISPLAY DEVICE PRODUCED USING SAME

This application is a 35 U.S.C. § 371 National Phase Entry Application from PCT/KR2018/006383, filed on Jun. 5, 2018, and designating the United States, which claims priority to and the benefits of Korean Patent Application No. 10-2017-0160329, filed with the Korean Intellectual Property Office on Nov. 28, 2017, the entire contents of which are incorporated herein by reference.

TECHNICAL FIELD

The present disclosure relates to a method for preparing a colorant composition, a colorant composition prepared using the same, a colorant dispersion, a photosensitive resin composition, a color filter and a liquid crystal display device.

BACKGROUND ART

As a light source of liquid crystal displays (LCD), LED or OLED devices performing self-light emission using neither driving nor liquid crystals have been widely used currently instead of existing CCFLs. When LEDs or OLEDs are used as a light source, red, green and blue light are produced by themselves, and therefore, separate color filters are not required.

However, matching or controlling required color coordinates using light coming from LED or OLED light sources is not generally simple.

Meanwhile, a pigment dispersion method using pigments as a colorant has been currently generally used to obtain a color filter. However, in a pigment dispersion, the pigment is present in a particle state, which not only scatters light but also increases a surface area of the pigment due to pigment micronizing, and from this, dispersion stability is worsened producing nonuniform pigment particles. Accordingly, using dyes instead of pigments as colorants has been reviewed in order to accomplish recently required high luminance, high contrast ratio and high resolution.

However, dyes generally have low solubility and are not well-dispersed, and have not been able to sufficiently satisfy brightness of a color filter.

DISCLOSURE

Technical Problem

The present disclosure is directed to providing a method for preparing a colorant composition capable of providing a colorant dispersion having a small dye particle diameter by going through a process of dissolving dye particles in a solvent and precipitating the dye particles, a colorant composition, a colorant dispersion and a photosensitive resin composition prepared using the same. In addition, the present disclosure is directed to providing a color filter manufactured using such a photosensitive resin composition, and a liquid crystal display device comprising the same.

Technical Solution

One embodiment of the present disclosure provides a method for preparing a colorant composition comprising dissolving a first xanthene-based dye having the same number of positive charges and negative charges, and a second xanthene-based dye having more negative charges than positive charges by one or more in a first solvent; and precipitating the dissolved first xanthene-based dye and the dissolved second xanthene-based dye in a second solvent.

Another embodiment of the present disclosure provides a colorant composition prepared using the above-described preparation method.

Another embodiment of the present disclosure provides a colorant dispersion comprising the colorant composition; a dispersant; an acrylic resin; and a solvent.

Another embodiment of the present disclosure provides a photosensitive resin composition comprising the colorant dispersion; a blue colorant dispersion; an acrylic resin; a multifunctional monomer; a surfactant; an initiator; and a solvent.

Another embodiment of the present disclosure provides a color filter provided with a transparent substrate, and a colored layer provided on the transparent substrate, wherein the colored layer comprises a cured material of the photosensitive resin composition.

Another embodiment of the present disclosure provides a liquid crystal display device comprising the color filter.

Advantageous Effects

According to embodiments of the present disclosure, a colorant composition and a colorant dispersion comprising dye particles with a small diameter, and as a result, a photosensitive resin composition having excellent heat resistance, stability and coloring capability, and is capable of obtaining high color gamut with a small amount of colorant can be obtained.

MODE FOR DISCLOSURE

One embodiment of the present disclosure provides a method for preparing a colorant composition comprising dissolving a first xanthene-based dye having the same number of positive charges and negative charges and a second xanthene-based dye having more negative charges than positive charges by one or more in a first solvent; and precipitating the dissolved first xanthene-based dye and the dissolved second xanthene-based dye in a second solvent.

According to one embodiment of the present specification, in a solvent dissolving both the first xanthene-based dye and the second xanthene-based dye, the first dye and the second dye go through sufficient solvation by the solvent, and the first xanthene-based dye and the second xanthene-based dye behave like monomers. Specifically, the first xanthene-based dye and the second xanthene-based dye are both xanthene-based dyes and have similar structures. By having such similar structures, the first xanthene-based dye and the second xanthene-based dye may have π-π interactions in the solvent.

The first xanthene-based dye of the present disclosure has the same number of positive charges and negative charges and is thereby neutralized, and the second xanthene-based dye has more negative charges than positive charges by one or more and is thereby anionic. A cationic dispersant may form ionic bonds with the anionic second xanthene-based dye to form a complex. The neutralized first xanthene-based dye may bond to the complex.

As a result, aggregation between the first xanthene-based dyes or between the second xanthene-based dyes may be prevented, and dispersibility of the first xanthene-based dye and the second xanthene-based dye is enhanced. Accordingly, dyes with a small particle diameter and a large surface area may be obtained, and coloring capability may increase by effectively absorbing light.

However, when preparing a dispersion by micronizing only the first xanthene-based dye without dissolving in a solvent, the first xanthene-based dye is difficult to form ionic bonds with a cationic dispersant since it has the same number of positive charges and negative charges and is neutralized. Accordingly, dye particle diameters increase since the dye is difficult to be dispersed in a solvent when only the first xanthene-based dye is present.

In addition, when preparing a dispersion by micronizing only the second xanthene-based dye without dissolving in a solvent, the dye may be lost during a process of washing the second xanthene-based dye with water after the micronizing.

Specifically, the second xanthene-based dye has more negative charges than positive charges by one or more and is thereby anionic, and the anionic group may be a sulfonate group. A colorant including a sulfonate group is readily ionized and dissolved in water. As a result, the colorant may be lost.

When preparing a colorant composition, a colorant dispersion and a photosensitive resin composition by micronizing the first xanthene-based dye and the second xanthene-based dye without dissolving in a solvent, the first xanthene-based dye and the second xanthene-based dye may not have sufficient n-n interactions in the solvent.

According to one embodiment of the present specification, a dispersant comprising a monomer or a polymer comprising an amine structure or an ammonium structure may be further comprised of the precipitating of the first xanthene-based dye and the second xanthene-based dye in a second solvent as necessary. Further comprising a dispersant comprising a monomer or a polymer comprising an amine structure or an ammonium structure may help with more uniform interactions of the first xanthene-based dye and the second xanthene-based dye in the precipitating of the dyes.

According to one embodiment of the present specification, the dissolving of a first xanthene-based dye and a second xanthene-based dye in a first solvent may comprise placing a first dye and a second dye in a first solvent and stirring the result for 10 hours to 30 hours and more preferably for 22 hours to 26 hours at −5° C. to 200° C. as necessary.

The temperature of the solution prepared by the stirring may be lowered after the preparation. The temperature may be lowered to room temperature as necessary.

According to one embodiment of the present specification, the first dye and the second dye need to be sufficiently solvated in the first solvent and the second solvent in the precipitating of the dissolved first xanthene-based dye and the dissolved second xanthene-based dye in the second solvent, and stirring for 10 minutes to 3 hours, preferably for 15 minutes to 45 minutes, may be comprised as necessary.

The preparing of a colorant composition comprising the precipitated first xanthene-based dye and the precipitated second xanthene-based dye may further comprise filtering the precipitated first xanthene-based dye and the precipitated second xanthene-based dye under vacuum, and washing the result.

After the filtering and the washing, drying may be further comprised. The drying on the first solvent and the second solvent may be carried out for 10 hours to 30 hours and preferably for 22 hours to 26 hours in a vacuum oven at 50° C. to 70° C. and preferably at 55° C. to 65° C.

According to another embodiment of the present disclosure, the first xanthene-based dye has a maximum absorption wavelength between 500 nm to 580 nm, and a difference between the maximum absorption wavelength of the first xanthene-based dye and a maximum absorption wavelength of the second xanthene-based dye is greater than 0 nm and less than or equal to 100 nm. The difference is preferably greater than 0 nm and less than or equal to 50 nm, and is most preferably greater than 0 nm and less than or equal to 20 nm. According to the embodiment, dispersion stability is not favorable when only the first xanthene-based dye is present, however, by mixing the second xanthene-based dye having similar chemical structure and absorption properties thereto, dispersion stability may be greatly improved while obtaining a color aiming to originally obtain with the first xanthene-based dye.

In the present specification, the first xanthene-based dye may be described as a first dye, and the second xanthene-based dye may be described as a second dye.

According to another embodiment of the present specification, the first xanthene-based dye comprises a dye represented by the following Chemical Formula 1 and having the same number of positive charges and negative charges, and the second xanthene-based dye comprises a dye represented by the following Chemical Formula 2 and having more negative charges than positive charges by one or more.

[Chemical Formula 1]

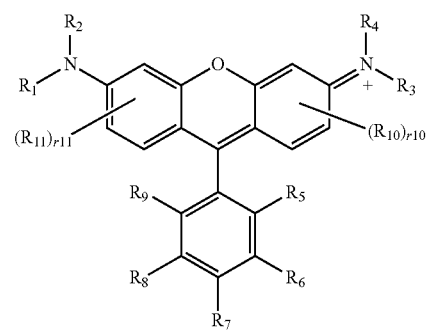

In Chemical Formula 1, $R_1$ to $R_4$ are the same as or different from each other, and each independently selected from the group consisting of hydrogen; deuterium; an anionic group; a hydroxyl group; a sulfonamide group; a sulfonate group; a substituted or unsubstituted alkyl group; a substituted or unsubstituted aryl group; a substituted or unsubstituted heteroaryl group; and a dianhydride group including a nitrogen atom, $R_5$ to $R_9$ are the same as or different from each other, and each independently selected from the group consisting of hydrogen; deuterium; an anionic group; a hydroxyl group; a sulfonamide group; a sulfonate group; a substituted or unsubstituted alkyl group; a substituted or unsubstituted aryl group; and a substituted or unsubstituted heteroaryl group, but at least one of $R_5$ to $R_9$ is an anionic group; a sulfonate group; or a sulfonamide group, and $R_{10}$ and $R_{11}$ are the same as or different from each other, and each independently hydrogen; deuterium; a halogen group; a nitro group; or a substituted or unsubstituted alkyl group, $r_{10}$ and $r_{11}$ are each an integer of 0 to 3, and when $r_{10}$ and $r_{11}$ are each 2 or greater, structures in the parentheses are the same as or different from each other.

[Chemical Formula 2]

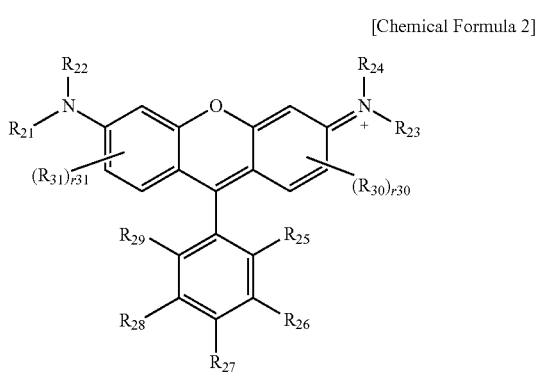

In Chemical Formula 2, $R_{21}$ to $R_{24}$ are the same as or different from each other, and each independently selected from the group consisting of hydrogen; deuterium; an anionic group; a hydroxyl group; a sulfonamide group; a sulfonate group; a substituted or unsubstituted alkyl group; a substituted or unsubstituted aryl group; a substituted or unsubstituted heteroaryl group; and a dianhydride group including a nitrogen atom, at least one of $R_{21}$ to $R_{24}$ is an alkyl group unsubstituted or substituted with an anionic group, a sulfonate group or a sulfonamide group; an aryl group substituted with an anionic group, a sulfonate group or a sulfonamide group; or a heteroaryl group substituted with an anionic group, a sulfonate group or a sulfonamide group, $R_{25}$ to $R_{29}$ are the same as or different from each other, and each independently selected from the group consisting of hydrogen; deuterium; an anionic group; a hydroxyl group; a sulfonamide group; a sulfonate group; a substituted or unsubstituted linear or branched alkyl group having 1 to 30 carbon atoms; a substituted or unsubstituted aryl group; and a substituted or unsubstituted heteroaryl group, but at least one of $R_{25}$ to $R_{29}$ is an anionic group; a sulfonate group; or a sulfonamide group, and $R_{30}$ and $R_{31}$ are the same as or different from each other, and each independently hydrogen; deuterium; a halogen group; a nitro group; or a substituted or unsubstituted alkyl group, $r_{30}$ and $r_{31}$ are each an integer of 0 to 3, and when $r_{30}$ and $r_{31}$ are each 2 or greater, structures in the parentheses are the same as or different from each other.

In one embodiment of the present specification, $R_1$ to $R_4$ are the same as or different from each other, and each independently selected from the group consisting of hydrogen; deuterium; a substituted or unsubstituted alkyl group; a substituted or unsubstituted aryl group; and a dianhydride group including a nitrogen atom, $R_{21}$ to $R_{24}$ are the same as or different from each other, and each independently selected from the group consisting of hydrogen; deuterium; a substituted or unsubstituted alkyl group; a substituted or unsubstituted aryl group; and a dianhydride group including a nitrogen atom, and the remaining substituents have the same definitions as above.

In Chemical Formula 1 of the present specification, $R_1$ to $R_4$ are the same as or different from each other, and each independently hydrogen; a substituted or unsubstituted alkyl group; a substituted or unsubstituted aryl group; or a dianhydride group including a nitrogen atom.

In Chemical Formula 1 of the present specification, $R_1$ to $R_4$ are hydrogen; an aryl group substituted with an anionic group or an alkyl group; or an alkyl group unsubstituted or substituted with a dianhydride group including a nitrogen atom.

In Chemical Formula 1 of the present specification, $R_1$ to $R_4$ are hydrogen; a phenyl group substituted with a methyl group; a phenyl group substituted with one or more selected from the group consisting of a methyl group and an anionic group; an ethyl group; a propyl group; or a propyl group substituted with a dianhydride group including a nitrogen atom.

In Chemical Formula 1 of the present specification, $R_5$ to $R_9$ are the same as or different from each other, and each independently hydrogen; or an anionic group.

In Chemical Formula 1 of the present specification, $R_5$ to $R_9$ are the same as or different from each other, and each independently hydrogen; or $SO_3^-$.

In Chemical Formula 1 of the present specification, $R_{10}$ and $R_{11}$ are the same as or different from each other, and each independently hydrogen; or deuterium, $r_{10}$ and $r_{11}$ are each an integer of 0 to 3, and when $r_{10}$ and $r_{11}$ are each 2 or greater, structures in the parentheses are the same as or different from each other.

In Chemical Formula 2 of the present specification, $R_{21}$ to $R_{24}$ are the same as or different from each other, and each independently a substituted or unsubstituted alkyl group; a substituted or unsubstituted aryl group; or a dianhydride group including a nitrogen atom.

In Chemical Formula 2 of the present specification, $R_{21}$ to $R_{24}$ are the same as or different from each other, and each independently an alkyl group unsubstituted or substituted with a heterocyclic group; or an aryl group substituted with one or more selected from the group consisting of an alkyl group, a sulfonate group and an anionic group.

In Chemical Formula 2 of the present specification, $R_{21}$ to $R_{24}$ are the same as or different from each other, and each independently an ethyl group; a propyl group; a propyl group substituted with a dianhydride group including a nitrogen atom; a phenyl group substituted with a methyl group; or a phenyl group substituted with one or more selected from the group consisting of a methyl group, a sulfonate group and an anionic group.

In one embodiment of the present specification, the first xanthene-based dye comprises a dye represented by the following Chemical Formula 1-1 and having the same number of positive charges and negative charges, and the second xanthene-based dye comprises a dye represented by the following Chemical Formula 2-1 and having more negative charges than positive charges by one or more.

[Chemical Formula 1-1]

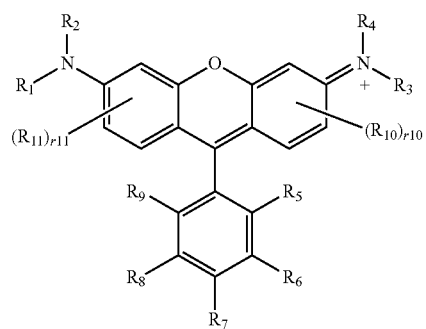

-continued

[Chemical Formula 2-1]

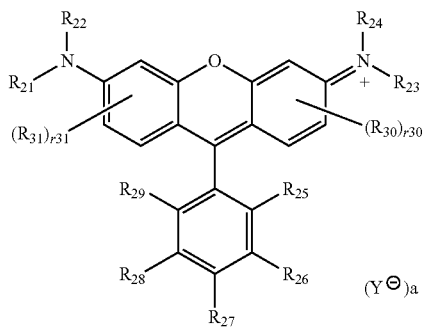

In Chemical Formulae 1-1 and 2-1,

Y is an anion, a is the number of negative charges higher than the number of positive charges.

The remaining substituents have the same definitions as above.

In the present specification, the anion may be an anion of a compound containing oxygen and at least one element selected from the group consisting of tungsten, molybdenum, silicon and phosphorous; an anion including a borate; an anion including an imide; or a carbon anion, but is not limited thereto.

As for the number of negative charges higher than the number of positive charges defined on the above-mentioned a, for example, a may be 2 or greater when the number of positive charges included in the second xanthene-based dye is 1, and a may be 3 or greater when the number of positive charges is 2.

The term "substituted or unsubstituted" in the present specification means being substituted with one or more substituents selected from the group consisting of deuterium; a halogen group; an alkyl group; an alkenyl group; an alkoxy group; a cycloalkyl group; an arylalkenyl group; an aryl group; an aryloxy group; an arylalkyl group; an arylalkenyl group; an alkylamine group; an aralkylamine group; a heteroaryl group; a hydroxyl group; a cyano group; a heterocyclic group including one or more of N, O, S or P atom; a dianhydride group including a nitrogen atom; a sulfonate group; a sulfonamide group; and an anionic group, or having no substituents.

In the present specification, the alkyl group may be linear or branched, and although not particularly limited thereto, the number of carbon atoms is preferably from 1 to 30. Specific examples thereof may include a methyl group, an ethyl group, a propyl group, an isopropyl group, a butyl group, a t-butyl group, a pentyl group, a hexyl group, a heptyl group and the like, but are not limited thereto.

In the present specification, the alkenyl group may be linear or branched, and although not particularly limited thereto, the number of carbon atoms is preferably from 2 to 30. Specific examples thereof preferably include an alkenyl group substituted with an aryl group such as a stylbenyl group or a styrenyl group, but are not limited thereto.

In the present specification, the alkoxy group may be linear or branched, and although not particularly limited thereto, the number of carbon atoms is preferably from 1 to 30. In the present specification, the alkenyloxy group may be linear or branched, and although not particularly limited thereto, the number of carbon atoms is preferably from 2 to 30.

In the present specification, the cycloalkyl group is not particularly limited, but preferably has 3 to 20 carbon atoms, and particularly, a cyclopentyl group or a cyclohexyl group is preferred.

In the present specification, examples of the halogen group may include fluorine, chlorine, bromine or iodine.

In the arylalkyl group in the present specification, the number of carbon atoms of the aryl part is from 6 to 30, and the number of carbon atoms of the alkyl part is from 1 to 30. Specific examples thereof may include a benzyl group, a p-methylbenzyl group, an m-methylbenzyl group, a p-ethylbenzyl group, an m-ethylbenzyl group, a 3,5-dimethylbenzyl group, an α-methylbenzyl group, an α,α-dimethylbenzyl group, an α,α-methylphenylbenzyl group, a 1-naphthylbenzyl group, a 2-naphthylbenzyl group, a p-fluorobenzyl group, a 3,5-difluorobenzyl group, an α,α-ditrifluoromethylbenzyl group, a p-methoxybenzyl group, an m-methoxybenzyl group, an α-phenoxybenzyl group, an α-benzyloxybenzyl group, a naphthylmethyl group, a naphthylethyl group, a naphthylisopropyl group, a pyrrolylmethyl group, a pyrrolylethyl group, an aminobenzyl group, a nitrobenzyl group, a cyanobenzyl group, a 1-hydroxy-2-phenylisopropyl group, a 1-chloro-2-phenylisopropyl group and the like, but are not limited thereto.

In the present specification, descriptions on aryl provided below may be applied to the aryl part of the arylalkenyl group, and descriptions on the alkenyl group provided above may be applied to the alkenyl part.

In the present specification, the aryl group may be a monocyclic aryl group or a polycyclic aryl group.

When the aryl group is a monocyclic aryl group, the number of carbon atoms is not particularly limited, but is preferably from 6 to 30. Specific examples of the monocyclic aryl group may include a phenyl group, a biphenyl group, a terphenyl group and the like, but are not limited thereto.

When the aryl group is a polycyclic aryl group, the number of carbon atoms is not particularly limited, but is preferably from 10 to 30. Specific examples of the polycyclic aryl group may include a naphthyl group, an anthryl group, a phenanthryl group, a pyrenyl group, a perylenyl group, a chrysenyl group, a fluorenyl group and the like, but are not limited thereto.

In the present specification, the fluorenyl group may have substituents, and the substituents may bond to form a spiro structure.

In the present specification, the heterocyclic group is a heterocyclic group including O, N or S as a heteroatom, and although not particularly limited thereto, the number of carbon atoms is preferably from 2 to 30. Examples of the heterocyclic group may include a thiophene group, a furan group, a pyrrole group, an imidazole group, a triazole group, an oxazole group, an oxadiazole group, a triazole group, a pyridyl group, a bipyridyl group, a triazine group, an acridyl group, a pyridazine group, a quinolinyl group, an isoquinoline group, an indole group, a carbazole group, a benzoxazole group, a benzimidazole group, a benzothiazole group, a benzocarbazole group, a benzothiophene group, a dibenzothiophene group, a benzofuranyl group, a dibenzofuran group and the like, but are not limited thereto.

In the present specification, the number of carbon atoms of the dianhydride group including a nitrogen atom is not particularly limited, but is preferably from 4 to 20. Examples thereof may include isoindoline-1,3-dione.

In the present specification, the alkylene group means having two bonding sites in alkane. The alkylene group may be linear, branched or cyclic. The number of carbon atoms of the alkylene group is not particularly limited, but, for example, is from 1 to 30.

In the present specification, the sulfonate group may be represented by —SO$_3$X', and X' may be hydrogen or a group 1 element. Examples of the sulfonate group may include —SO$_3$H, —SO$_3$Li, —SO$_3$K or —SO$_3$Na.

In the present specification, the sulfonamide group may be represented by —SO$_2$NRxRy, and for example, Rx and Ry are the same as or different from each other, and each independently a substituted or unsubstituted linear or branched alkyl group having 1 to 30 carbon atoms; a substituted or unsubstituted monocyclic or polycyclic aryl group having 6 to 30 carbon atoms; or a substituted or unsubstituted monocyclic or polycyclic heteroaryl group having 2 to 30 carbon atoms.

In the present specification, the anionic group forms chemical bonds with the structure of Chemical Formula 1. The anionic group is not particularly limited, and for example, anions described in U.S. Pat. No. 7,939,644, Japanese Patent Application Laid-Open Publication No. 2006-003080, Japanese Patent Application Laid-Open Publication No. 2006-001917, Japanese Patent Application Laid-Open Publication No. 2005-159926, Japanese Patent Application Laid-Open Publication No. 2007-7028897, Japanese Patent Application Laid-Open Publication No. 2005-071680, Korean Patent Application Laid-Open Publication No. 2007-7000693, Japanese Patent Application Laid-Open Publication No. 2005-111696, Japanese Patent Application Laid-Open Publication No. 2008-249663 and Japanese Patent Application Laid-Open Publication No. 2014-199436 may be used. Specific examples of the anionic group may include a trifluoromethanesulfonic acid anion, a bis(trifluoromethylsulfonyl)amide anion, a bistrifluoromethanesulfonimide anion, a bisperfluoroethylsulfonimide anion, a tetraphenylborate anion, tetrakis(4-fluorophenyl)borate, tetrakis(pentafluorophenyl)borate, tristrifluoromethanesulfonylmethide, SO$_3^-$, CO$_2^-$, SO$_2$N$^-$SO$_2$CF$_3$, SO$_2$N$^-$SO$_2$CF$_2$CF$_3$, a halogen group such as a fluorine group, an iodine group or a chlorine group, and the like, but are not limited thereto.

In the present specification, the anionic group may have anions by itself, or may be present in a complex form with other cations. Accordingly, depending on the number of the substituted anionic groups, a sum of total charges of the compound molecule of the present disclosure may vary. Since the compound of the present disclosure has a cation in one amine group, the sum of total charges of the molecule may have a value from an anion corresponding to a value subtracting 1 from the number of substituted anionic groups to 0.

In the present specification, a monomer is a repeating unit forming a polymer, and the monomer may form a polymer by being included in the main chain in the polymer.

In the present specification, the unit means, as a repeating unit of a monomer included in a polymer, a structure in which the monomer bonds in the polymer by the polymer.

According to another embodiment of the present specification, the first xanthene-based dye comprises a dye represented by the following Chemical Formula 3 and having the same number of positive charges and negative charges, and the second xanthene-based dye comprises a dye represented by the following Chemical Formula 4 and having more negative charges than positive charges by one or more.

[Chemical Formula 3]

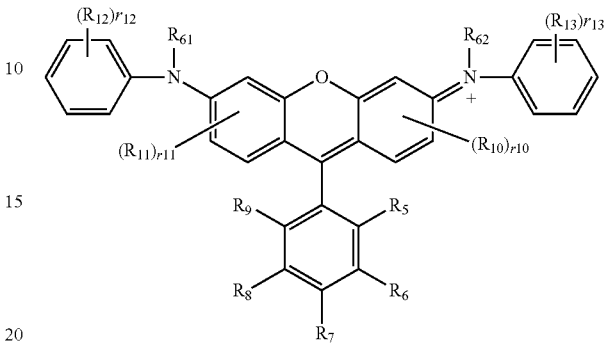

[Chemical Formula 4]

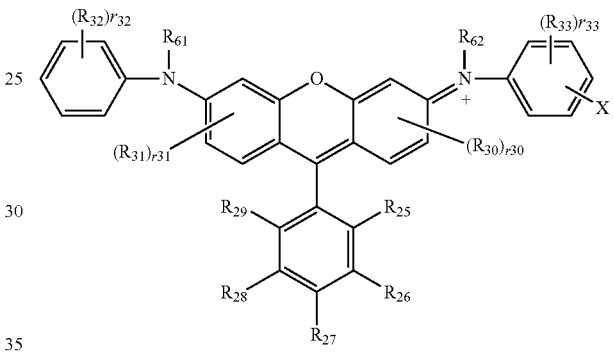

In Chemical Formulae 3 and 4, $R_{12}$, $R_{13}$, $R_{32}$ and $R_{33}$ are the same as or different from each other, and each independently hydrogen; deuterium; a halogen group; a nitro group; or a substituted or unsubstituted alkyl group, $r_{12}$ and $r_{13}$ are each an integer of 0 to 5, $r_{32}$ is an integer of 0 to 5, $r_{33}$ is an integer of 0 to 4, and when $r_{12}$, $r_{13}$, $r_{32}$ and $r_{33}$ are each 2, structures in the parentheses are the same as or different from each other, $R_{61}$ and $R_{62}$ are the same as or different from each other, and each independently hydrogen; deuterium; a substituted or unsubstituted alkyl group; or a dianhydride group including a nitrogen atom, X is an anionic group; a sulfonate group; or a sulfonamide group, and the remaining substituents have the same definitions as above.

According to one embodiment, $R_{61}$ and $R_{62}$ may each be hydrogen.

In another embodiment of the present specification, the first xanthene-based dye comprises a dye represented by the following Chemical Formula 3-1 and having the same number of positive charges and negative charges, and the second xanthene-based dye may comprise a dye represented by the following Chemical Formula 4-1 and having more negative charges than positive charges by one or more.

[Chemical Formula 3-1]

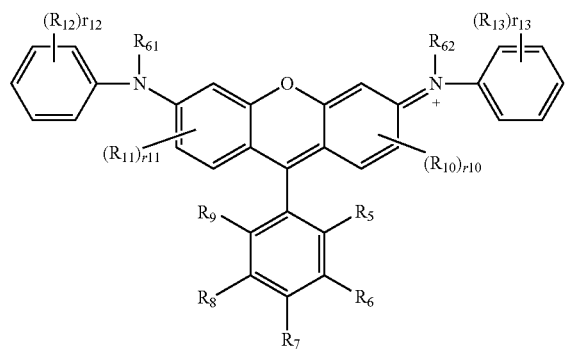

[Chemical Formula 4-2]

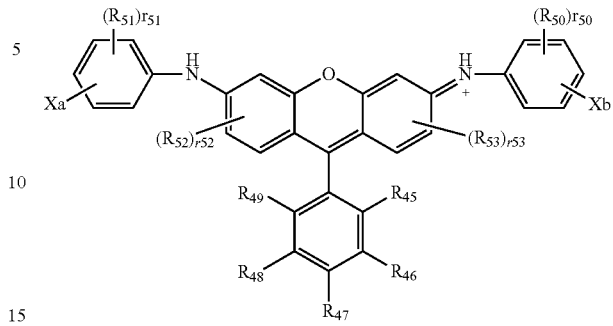

[Chemical Formula 4-1]

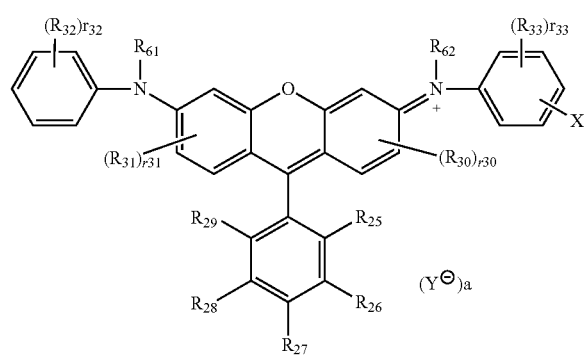

In Chemical Formulae 3-1 and 4-1, $R_{12}$, $R_{13}$, $R_{32}$ and $R_{33}$ are the same as or different from each other, and each independently hydrogen; deuterium; a halogen group; a nitro group; a substituted or unsubstituted alkyl group; an anionic group; a sulfonate group; or a sulfonamide group, $r_{12}$ and $r_{13}$ are each an integer of 0 to 5, $r_{32}$ is an integer of 0 to 5, $r_{33}$ is an integer of 0 to 4, and when $r_{12}$, $r_{13}$, $r_{32}$ and $r_{33}$ are each 2 or greater, structures in the parentheses are the same as or different from each other, X is an anionic group; a sulfonate group; or a sulfonamide group, and the remaining substituents have the same definitions as above.

According to one embodiment, $R_{61}$ and $R_{62}$ may each be hydrogen.

When using the second xanthene-based dye comprising the dye of Chemical Formula 4, the colorant composition may further comprise a dye of the following Chemical Formula 4-2.

In Chemical Formula 4-2, $R_{50}$ to $R_{53}$ are the same as or different from each other, and each independently hydrogen; deuterium; a halogen group; a nitro group; or a substituted or unsubstituted alkyl group, $r_{50}$ and $r_{51}$ are each an integer of 0 to 4, $r_{52}$ and $r_{53}$ are each an integer of 0 to 3, and when $r_{50}$ to $r_{53}$ are each 2 or greater, structures in the parentheses are the same as or different from each other, Xa and Xb are the same as or different from each other, and each independently an anionic group; a sulfonate group; or a sulfonamide group, $R_{45}$ to $R_{49}$ are the same as or different from each other, and each independently selected from the group consisting of hydrogen; deuterium; an anionic group; a hydroxyl group; a sulfonamide group; a sulfonate group; a substituted or unsubstituted linear or branched alkyl group having 1 to 30 carbon atoms; a substituted or unsubstituted aryl group; and a substituted or unsubstituted heteroaryl group, but at least one of $R_{45}$ to $R_{59}$ is an anionic group; a sulfonate group; or a sulfonamide group.

According to another embodiment of the present disclosure, the first xanthene-based dye comprises a dye represented by the following Chemical Formula 5 and having the same number of positive charges and negative charges, and the second xanthene-based dye comprises a dye represented by the following Chemical Formula 6 and having more negative charges than positive charges by one or more.

[Chemical Formula 5]

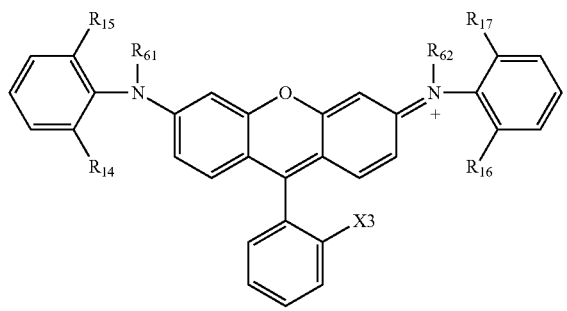

[Chemical Formula 6]

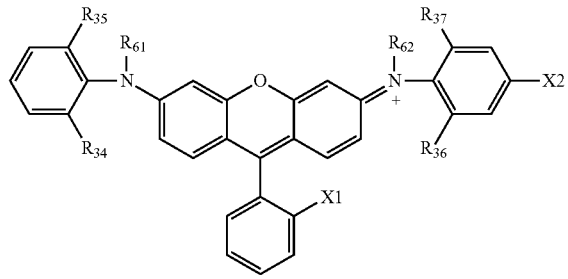

In Chemical Formulae 5 and 6, $R_{14}$ to $R_{17}$, and $R_{34}$ to $R_{37}$ are the same as or different from each other, and each independently a substituted or unsubstituted alkyl group, $R_{61}$ and $R_{62}$ are the same as or different from each other, and each independently hydrogen; deuterium; a substituted or unsubstituted alkyl group; or a dianhydride group including a nitrogen atom, and X1 to X3 are the same as or different from each other, and each independently an anionic group; a sulfonate group; or a sulfonamide group.

According to one embodiment, $R_{14}$ to $R_{17}$, and $R_{34}$ to $R_{37}$ may be a methyl group.

According to one embodiment, $R_{61}$ and $R_{62}$ may each be hydrogen.

In another embodiment of the present specification, the first xanthene-based dye comprises a dye represented by the following Chemical Formula 5-1 and having the same number of positive charges and negative charges, and the second xanthene-based dye may comprise a dye represented by the following Chemical Formula 6-1 and having more negative charges than positive charges by one or more.

[Chemical Formula 5-1]

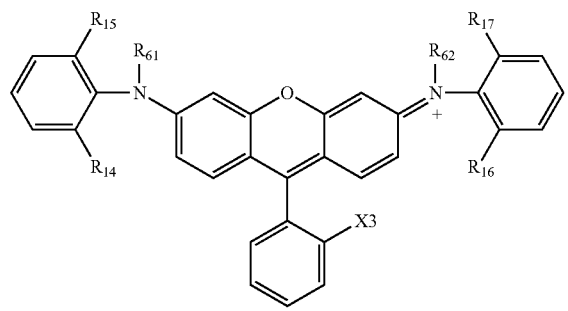

[Chemical Formula 6-1]

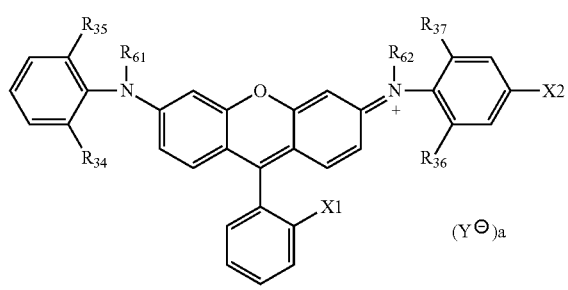

$(Y^\ominus)_a$

In Chemical Formulae 5-1 and 6-1,

Y is an anion, a is the number of negative charges higher than the number of positive charges, and the remaining substituents have the same definitions as above.

According to one embodiment, $R_{61}$ and $R_{62}$ may each be hydrogen.

According to one embodiment, when using the second xanthene-based dye comprising the dye of Chemical Formula 6, the colorant composition may further comprise a dye of the following Chemical Formula 6-2.

[Chemical Formula 6-2]

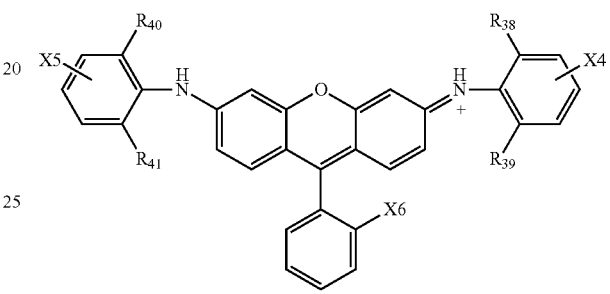

In Chemical Formula 6-2, $R_{38}$ to $R_{41}$ are the same as or different from each other, and each independently a substituted or unsubstituted alkyl group, and X4 to X6 are the same as or different from each other, and each independently an anionic group; a sulfonate group; or a sulfonamide group.

In one embodiment of the present specification, the first xanthene-based dye may be any one of the following structures.

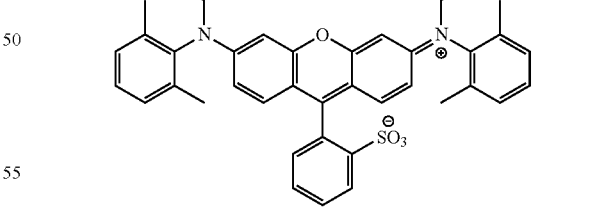

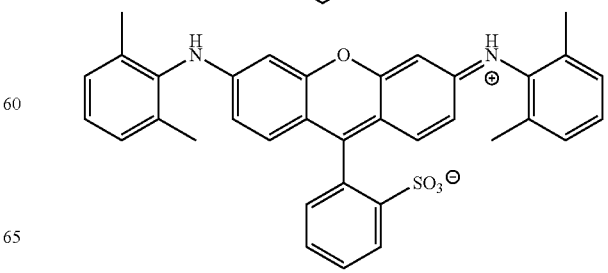

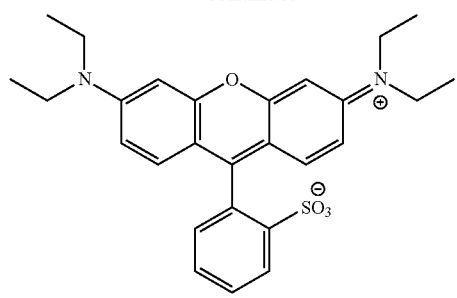

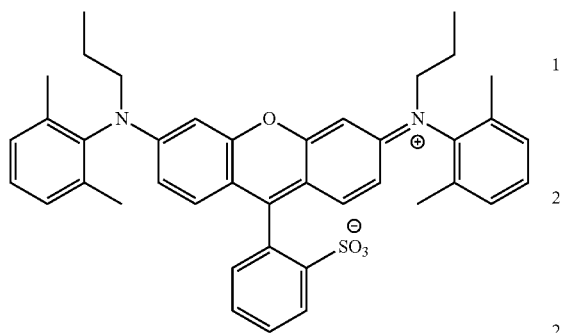

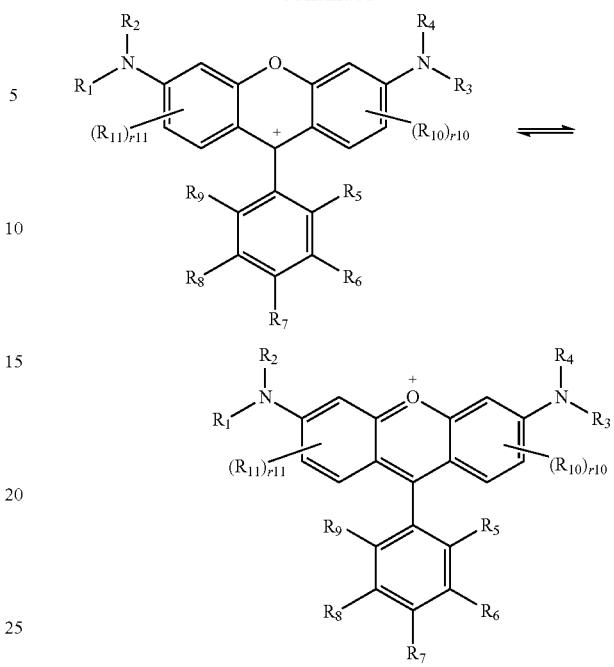

Descriptions on the isomers may be applied to all the xanthene-based dye structures described in the present specification.

In one embodiment of the present specification, the second xanthene-based dye may be any one of the following structures.

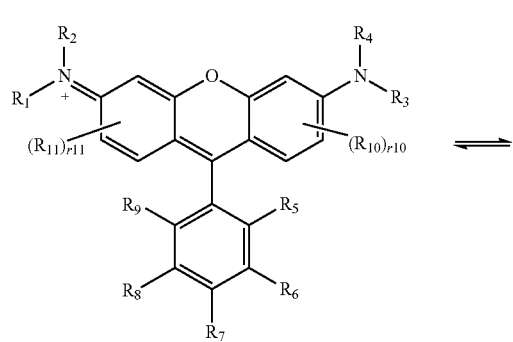

In one embodiment of the present specification, Chemical Formula 1 may be represented by the following structures. The following structures represent isomers of Chemical Formula 1, Chemical Formula 1 represents a representative structure. Isomers mean molecules having the same molecular formula but having different physical/chemical properties.

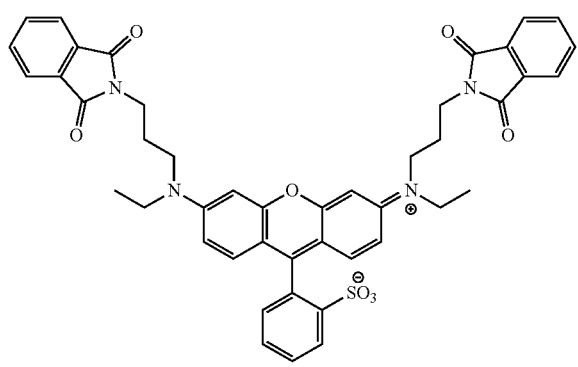

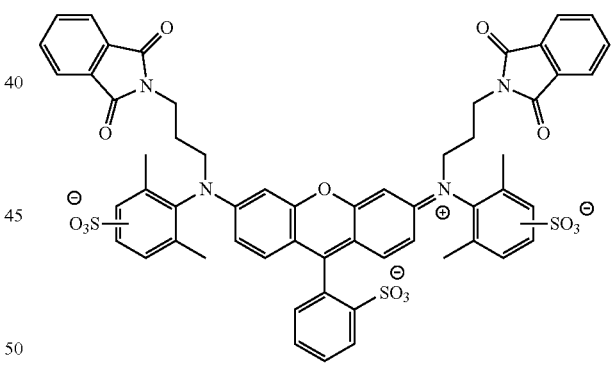

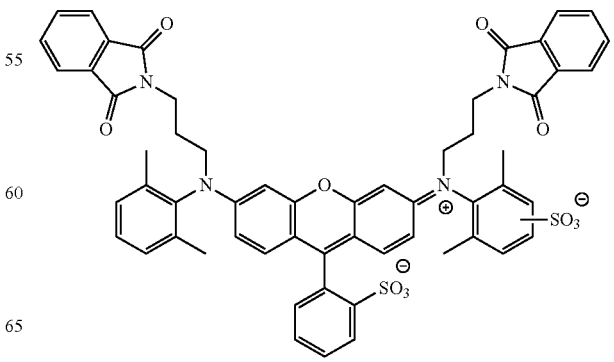

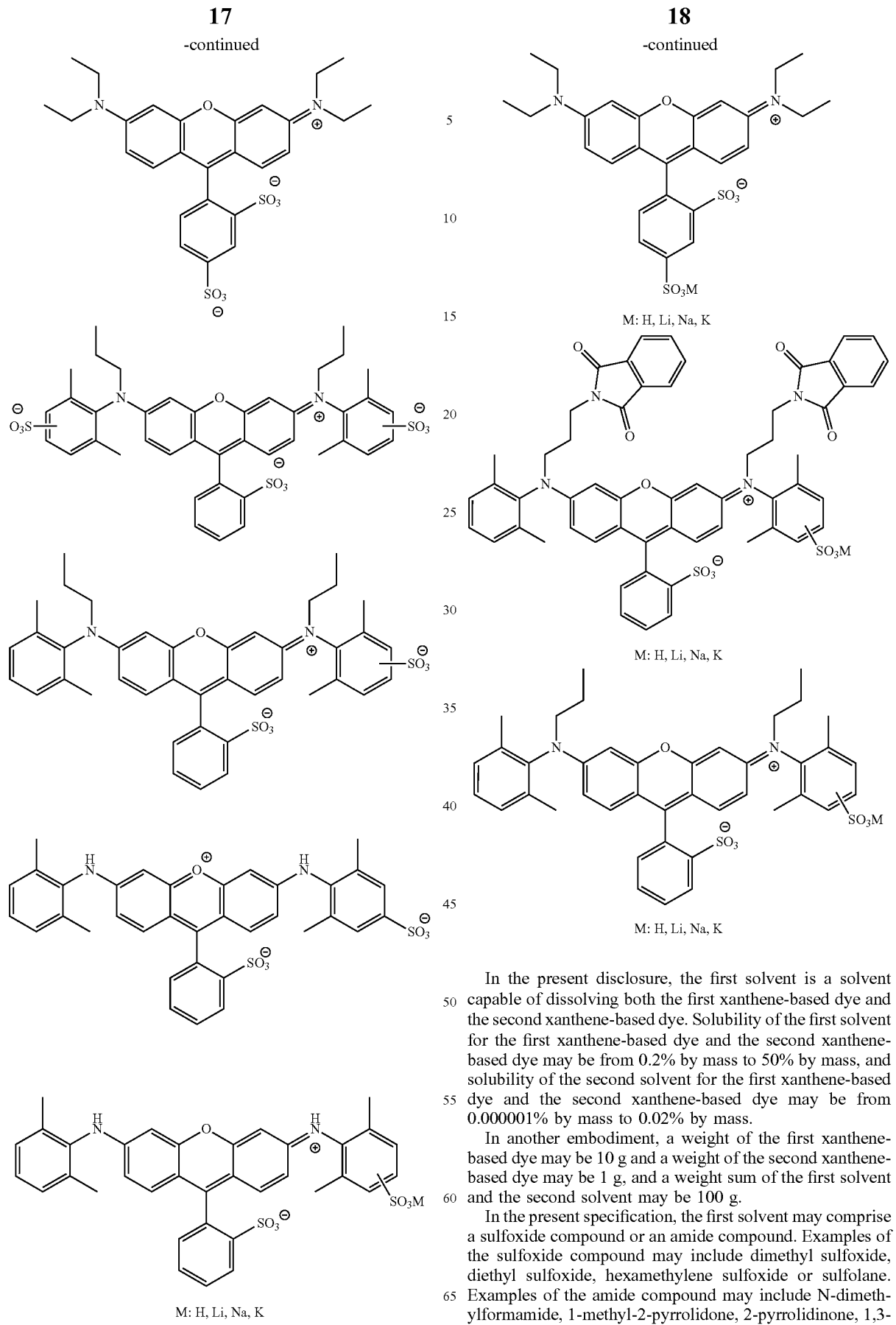

In the present disclosure, the first solvent is a solvent capable of dissolving both the first xanthene-based dye and the second xanthene-based dye. Solubility of the first solvent for the first xanthene-based dye and the second xanthene-based dye may be from 0.2% by mass to 50% by mass, and solubility of the second solvent for the first xanthene-based dye and the second xanthene-based dye may be from 0.000001% by mass to 0.02% by mass.

In another embodiment, a weight of the first xanthene-based dye may be 10 g and a weight of the second xanthene-based dye may be 1 g, and a weight sum of the first solvent and the second solvent may be 100 g.

In the present specification, the first solvent may comprise a sulfoxide compound or an amide compound. Examples of the sulfoxide compound may include dimethyl sulfoxide, diethyl sulfoxide, hexamethylene sulfoxide or sulfolane. Examples of the amide compound may include N-dimethylformamide, 1-methyl-2-pyrrolidone, 2-pyrrolidinone, 1,3-dimethyl-2-imidazolidinone, ε-caprolactam, formamide, N-methylformamide, acetoamide, N-methylacetamide, N,N-dimethylacetoamide, N-methylpropanamide or hexamethylphosphoric triamide.

Specifically, the first solvent may be N-methylpyrrolidone or dimethylformamide.

In the present disclosure, the second solvent may comprise one, two or more selected from the group consisting of water, hydrochloric acid, sodium hydroxide, alcohol compounds, ketone compounds, ether compounds, aromatic compounds, carbon disulfide, aliphatic compounds, nitrile compounds, halogen compounds, ester compounds and ionic liquids.

Examples of the alcohol compound may include methanol, ethanol, isopropyl alcohol, n-propyl alcohol or 1-methoxy-2-propanol, but are not limited thereto.

Examples of the ketone compound may include acetone, methyl ethyl ketone, methyl isobutyl ketone or cyclohexanone, but are not limited thereto.

Examples of the ether compound may include dimethyl ether, diethyl ether or tetrahydrofuran, but are not limited thereto.

Examples of the aromatic compound may include benzene or toluene, but are not limited thereto.

Examples of the aliphatic compound may include hexane, but are not limited thereto.

Examples of the nitrile compound may include acetonitrile, but are not limited thereto.

Examples of the halogen compound may include dichloromethane or trichloroethylene, but are not limited thereto.

Examples of the ester compound may include dimethyl ether, diethyl ether, tetrahydrofuran, but are not limited thereto.

The ionic liquid may be a salt of 1-butyl-3-methylimidazolium and hexafluorophosphate ($PF_6^-$), but is not limited thereto.

Specific examples of the second solvent may include one or more types selected from the group consisting of acetone, methyl ethyl ketone, methyl isobutyl ketone, methyl cellosolve, ethyl cellosolve, tetrahydrofuran, 1,4-dioxane, ethylene glycol dimethyl ether, ethylene glycol diethyl ether, propylene glycol dimethyl ether, propylene glycol diethyl ether, diethylene glycol dimethyl ether, diethylene glycol diethyl ether, diethylene glycol methylethyl ether, chloroform, methylene chloride, 1,2-dichloroethane, 1,1,1-trichloroethane, 1,1,2-trichloroethane, 1,1,2-trichloroethene, hexane, heptane, octane, cyclohexane, benzene, toluene, xylene, methanol, ethanol, isopropanol, propanol, butanol, t-butanol, 2-ethoxypropanol, 2-methoxypropanol, 3-methoxybutanol, cyclohexanone, cyclopentanone, propylene glycol methyl ether acetate, propylene glycol ethyl ether acetate, 3-methoxybutyl acetate, ethyl 3-ethoxypropionate, ethyl cellosolve acetate, methyl cellosolve acetate, butyl acetate, propylene glycol monomethyl ether and dipropylene glycol monomethyl ether, but are not limited thereto.

According to one embodiment of the present specification, the second solvent may be ethyl acetate or diethyl ether.

In one embodiment of the present specification, a weight of the second dye may be from 0.001% to 99.999% and preferably from 0.05% to 1.0% with respect to a weight of the first dye. In addition, a total weight of the solvent including the first solvent and the second solvent may be from 1 time to 100 times and preferably from 5 times to 15 times with respect to a total weight of the first dye and the second dye.

Another embodiment of the present specification provides a colorant dispersion comprising the colorant composition described above; a dispersant; an acrylic resin; and a solvent.

In the present specification, the colorant dispersion may be replaced by a term mill base. Herein, the colorant composition included in the colorant dispersion means a state where the solvent is removed. When a salt is used in the colorant composition, the salt is also removed with the solvent by washing for the colorant composition to be included in the colorant dispersion.

According to one embodiment, the colorant dispersion may further comprise a bead. As the bead, those having a particle diameter of 0.05 mm to 1.5 mm may be used. As a specific example, beads having a particle diameter of 0.1 mm, 0.3 mm, 0.5 mm, 0.8 mm and/or 1 mm may be used. As materials of the bead, one or more types of aluminum oxide, aluminum silicate, zirconium oxide, and/or silicon nitride may be used. The amount of the bead used is not particularly limited, but may be 10 times to 40 times with respect to a sum of the weights of the colorant composition and the dispersant. Such a bead may perform a role of dispersing composition components included in the colorant dispersion.

According to another embodiment of the present disclosure, the colorant dispersion described above may further comprise one or more types of dyes and pigments. As one example, the colorant dispersion may further comprise a phthalocyanine pigment, and for example, may comprise PB15:6. In addition, one or more pigments or dyes selected from the group consisting of metal-free phthalocyanine-based pigments or dyes, metal phthalocyanine-based pigments or dyes, triarylmethane-based pigments or dyes, quinophthalone-based pigments or dyes, isoindoline-based pigments or dyes, azo-based pigments or dyes, azo-metal complex-based pigments or dyes, perylene-based pigments or dyes, diketopyrrolo-pyrrole-based pigments or dyes, anthraquinone-based pigments or dyes, dipyrromethene-based pigments or dyes, porphyrin-based pigments or dyes, tetra aza porphyrin-based pigments or dyes, rhodamine-based pigments or dyes and xanthene-based pigments or dyes may be further comprised.

In one embodiment of the present specification, the method for preparing a colorant composition may further comprise micronizing the precipitated first xanthene-based dye and the precipitated second xanthene-based dye. The micronizing means a process of micronizing the colorant composition by applying physical force. According to one embodiment, diameters of the dispersed particles of the colorant composition obtained by the micronizing process are from 40 nm to 100 nm. Herein, the diameter means, as a maximum length of the dispersed particle, (major axis of particle+minor axis of particle)/2.

Diameters of the particles after the micronizing may be measured using a SEM or TEM apparatus. A specific example using a SEM measuring method is as follows. First, 0.01 g of the colorant dispersion including the micronized particles is placed in a chloroform solvent, and the result is treated for 10 minutes using an ultrasonic device JAC-5020 manufactured by KODO Technical Research Co., Ltd. with medium intensity to fully separate the particles from each other. After that, approximately one drop thereof is dropped on glass, and the result is heat treated for 5 minutes on a hot plate of 50° C. to remove the solvent. Pt was coated on the particles to a thickness of approximately 100 Å to 200 Å, and the particle diameters are observed using a SEM.

After preparing a colorant dispersion, approximately one quarter of a 1 cm×5 cm cell is filled with a PGEMA solvent, and approximately 1 to 2 drops of the colorant dispersion are dropped thereto. After well-dissolving the colorant dispersion in the solvent, particle sizes are measured using a particle size analyzer of Malvern Panalytical Ltd.. Particle size distribution is measured by measuring changes in the angles depending on intensity of scattered light obtained while a laser beam passes through the dispersed fine particle sample.

When diameters of particles dispersed in the colorant dispersion are greater than 100 nm, there is a problem of decreasing a contrast ratio caused by light scattering, and when sizes of the dispersed particles are too small, a contrast ratio and dispersion (mill base) stability decrease due to reaggregation to each other, and therefore, a range of 40 nm to 100 nm and more preferably 40 nm to 80 nm is proper.

The micronizing may include, as necessary, placing a salt and a solvent in a stirrer and stirring the result. The stirring may be carried out for 4 hours to 8 hours, preferably for 5 hours to 7 hours, at 40° C. to 60° C. and preferably at 45° C. to 55° C. After that, introducing 60° C. to 80° C., preferably 65° C. to 75° C. hot water thereto and stirring the result for 30 minutes to 2 hours, and preferably for 1 hour, may be further included. Filtering and washing are repeated, and residual salt and solvent may be removed. After removing the salt and the solvent, drying the result for 10 hours to 30 hours at 70° C. to 90° C. may be included.

The salt may perform a role of micronizing the dispersed particles in the micronizing. The salt may be removed by washing using a solvent such as distilled water, and is not particularly limited as long as it is a component capable of helping with micronizing. For example, materials such as NaCl may be used. When using a salt, the amount to use may be determined as needed, and for example, approximately 2 times to 8 times and preferably approximately 3 times to 5 times may be used with respect to a weight sum of the first and the second xanthene-based dyes. The salt may be removed by washing as described above, and the solvent may also be removed together in this case. The washing may be carried out once, or several times of twice or more as necessary.

In the present specification, the solvent used in the micronizing process, the solvent used in the colorant dispersion and the solvent used in the photosensitive resin composition may be the same as or different from the examples illustrated in the first solvent or the second solvent described above. When these solvents are the same as the examples of the first solvent or the second solvent, there is no risk of side-effects occurring by the residual solvent when preparing the photosensitive resin composition. When these solvents are different from the examples of the first solvent or the second solvent, the residual solvent may affect the photosensitive resin composition, and additional measures to minimize the residual solvent may be required.

In one embodiment of the present specification, the first xanthene-based dye bonds to the second xanthene-based dye through π-π interactions, and the second xanthene-based dye may form ionic bonds with the dispersant. As a result, diameters of the dye particles may decrease by preventing aggregation between the first xanthene-based dyes or between the second xanthene-based dyes, and dispersibility of the dyes may be enhanced.

In one embodiment of the present specification, viscosity of the dispersed particles of the colorant composition may be from 2.5 cP to 6.5 cP.

According to one embodiment of the present disclosure, the second xanthene-based dye may further comprise a counter cation. The colorant composition according to one embodiment of the present disclosure may further comprise a counter cation in the second xanthene-based dye in the number corresponding to the number of negative charges higher than the number of positive charges. The counter cation may be a hydrogen ion, a sodium ion or a cationic group, and for example, 1 to 7 of these may be included per one molecule of the second xanthene-based dye.

According to another embodiment of the present disclosure, the dispersant may further comprise a counter anion. The counter anion may be an inorganic or organic anion, and specifically, may be a halogen group such as Cl⁻. The dispersant may comprise the counter anion in the number corresponding to the number of positive charges of the dispersant.

The colorant composition according to one embodiment of the present disclosure may be washed as below. In this case, the counter cation or the counter anion is removed, and the cationic structure included in the dispersant may perform a role of a counter cation of the second xanthene-based dye.

As the dispersant, compound-type, non-ionic, anionic or cationic dispersants may be used, and examples thereof may include fluorine-based, ester-based, cation-based, anion-based, non-ion-based, amphoteric surfactants and the like may be included. These may be used either alone, or as a combination of two or more types.

In addition, the dispersant in the present specification may comprise an amine structure or an ammonium structure. The amine structure may be primary amine, secondary amine or tertiary amine.

Specifically, the dispersant may be one or more types selected from the group consisting of polyalkylene glycol and esters thereof, polyoxyalkylene polyalcohols, ester alkylene oxide adducts, alcohol alkylene oxide adducts, sulfonic acid esters, sulfonates, carboxylic acid esters, carboxylates, alkylamide alkylene oxide adducts and alkylamine, but is not limited thereto.

According to one embodiment of the present specification, the dispersant may be LPN-21116 of BYK-Chemie, but is not limited thereto. For example, the dispersant may be DISPERBYK-2001, DISPERBYK-2000, BYK-LPN6919, BYK-LPN21116, BYK-LPN22102, DISPER BYK-160, DISPER BYK-161, DISPER BYK-162, DISPER BYK-163, DISPER BYK-164, DISPER BYK-166, DISPER BYK-171, DISPER BYK-182 or DISPER BYK-184 of BYK-Chemie; EFKA-44, EFKA-46, EFKA-47, EFKA-48, EFKA-4010, EFKA-4050, EFKA-4055, EFKA-4020, EFKA-4015, EFKA-4060, EFKA-4300, EFKA-4330, EFKA-4400, EFKA-4406, EFKA-4510 or EFKA-4800 of BASF Corporation; SOLSPERS-24000, SOLSPERS-32550 or NBZ-420410 of Lubirzol Corporation; HINOACT T-6000, HINOACT T-7000 or HINOACT T-8000 of Kawaken Fine Chemicals Co., Ltd.; AJISPUR PB-821, AJISPUR PB-822 or AJISPUR PB-823 of Ajinomoto Fine-Techno Co., Inc.; or FLORENE DOPA-17HF, FLORENE DOPA-15BHF, FLORENE DOPA-33 or FLORENE DOPA-44 of Kyoeisha Chemical Co., Ltd.. Other resin-type dispersants other than the acrylic dispersant may be used either alone or as a combination of two or more types, or may also be used in combination with acryl dispersion.

In another embodiment of the present specification, the dispersant may be represented by the following Chemical Formula 7.

[Chemical Formula 7]

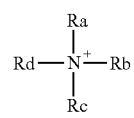

In Chemical Formula 7,

Ra to Rd are the same as or different from each other, and each independently hydrogen; a substituted or unsubstituted alkyl group; a substituted or unsubstituted alkenyl group; a substituted or unsubstituted aryl group; a substituted or unsubstituted arylalkyl group; -L-NHCO—R; or -L-OCO—R, or two of Ra to Rd bond to each other to form a substituted or unsubstituted ring, R is hydrogen; a substituted or unsubstituted alkyl group; a substituted or unsubstituted aryl group; or a substituted or unsubstituted arylalkyl group, and L is a substituted or unsubstituted alkylene group.

In one embodiment of the present specification, specific examples of the dispersant comprising an ammonium structure may be selected from the group consisting of tetramethyl ammonium chloride (cation part molecular weight is 74), tetraethyl ammonium chloride (cation part molecular weight is 122), monostearyl trimethyl ammonium chloride (cation part molecular weight is 312), distearyl dimethyl ammonium chloride (cation part molecular weight is 550), tristearyl monomethyl ammonium chloride (cation part molecular weight is 788), cetyl trimethyl ammonium chloride (cation part molecular weight is 284), trioctyl methyl ammonium chloride (cation part molecular weight is 368), dioctyl dimethyl ammonium chloride (cation part molecular weight is 270), monolauryl trimethyl ammonium chloride (cation part molecular weight is 228), dilauryl dimethyl ammonium chloride (cation part molecular weight is 382), trilauryl methyl ammonium chloride (cation part molecular weight is 536), triamyl benzyl ammonium chloride (cation part molecular weight is 318), trihexyl benzyl ammonium chloride (cation part molecular weight is 360), trioctyl benzyl ammonium chloride (cation part molecular weight is 444), trilauryl benzyl ammonium chloride (cation part molecular weight is 612), benzyl dimethyl stearyl ammonium chloride (cation part molecular weight is 388), benzyl dimethyl octyl ammonium chloride (cation part molecular weight is 248), and dialkyl (alkyl is C14 to C18) dimethyl ammonium chloride (cured tallow) (cation part molecular weight is 438~550). In addition, products thereof may include QUARTAMIN 24P, QUARTAMIN 86P CONC, QUARTAMIN 60W, QUARTAMIN 86W, QUARTAMIN D86P, SANISOL C or SANISOL B-50 of Kao Chemicals; AQUAD 210-80E, 2C-75, 2HT-75, 2HT FLAKE, 2O -75I, 2HP-75 or 2HP FLAKE of Lion Specialty Chemicals Co., Ltd., and the like, and QUARTAMIN D86P (distearyl dimethyl ammonium chloride) or AQUAD 2HT-75 (dialkyl (alkyl is C14 to C18) dimethyl ammonium chloride) is preferably used.

In another embodiment of the present specification, the dispersant may comprise a unit of the following Chemical Formula 8.

[Chemical Formula 8]

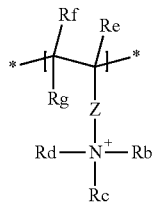

In Chemical Formula 8,

Rb to Rd are the same as or different from each other, and each independently hydrogen; a substituted or unsubstituted alkyl group; a substituted or unsubstituted alkenyl group; a substituted or unsubstituted aryl group; or a substituted or unsubstituted arylalkyl group, or two of Rb to Rd bond to each other to form a substituted or unsubstituted ring, Z is an alkylene group; an arylene group; -L-NHCO—; or -L-OCO—, and L is an alkylene group, and Re to Rg are the same as or different from each other, and each independently hydrogen; or an alkyl group.

According to another embodiment of the present disclosure, the dispersant has a weight average molecular weight of 1,000 to 10,000. The weight average molecular weight is preferably from 3,000 to 8,000 and more preferably from 5,000 to 7,000.

According to one embodiment, an end of the dispersant may be hydrogen, a halogen group or an alkyl group.

According to another embodiment of the present disclosure, the dispersant further comprises at least one of the following Chemical Formulae 9 to 12 in addition to the unit of Chemical Formula 8.

[Chemical Formula 9]

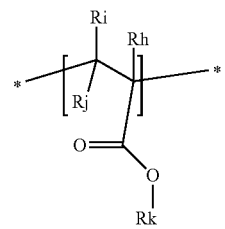

[Chemical Formula 10]

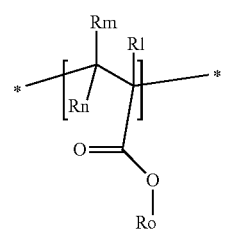

[Chemical Formula 11]

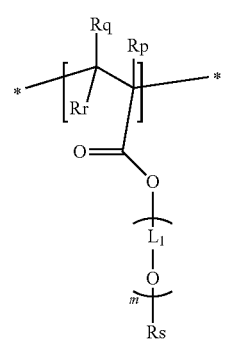

[Chemical Formula 12]

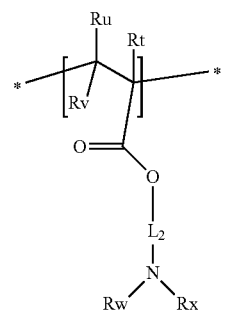

In Chemical Formulae 9 to 12,

Rh, Ri, Rj, Rl, Rm, Rn, Rp, Rq, Rr, Rt, Ru and Rv are the same as or different from each other, and each independently hydrogen or an alkyl group having 1 to 20 carbon atoms, Rk and Rs are the same as or different from each other, and each independently an alkyl group having 1 to 20 carbon atoms, Ro is an arylalkyl group having 7 to 20 carbon atoms, Rw and Rx are the same as or different from each other, and each independently hydrogen, an alkyl group having 1 to 20 carbon atoms, or an arylalkyl group having 7 to 20 carbon atoms, and $L_1$ and $L_2$ are the same as or different from each other, and each independently an alkylene group having 1 to 6 carbon atoms, and m is an integer of 1 to 6.

As specific examples, the dispersant may comprise the following units, and requisitely comprises the rightmost unit among these.

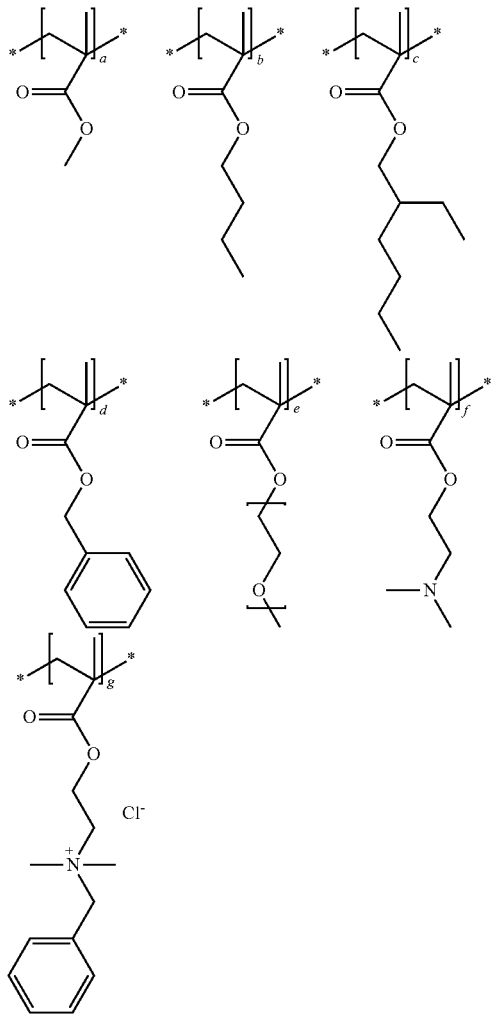

In the structures, a to g is a mol % based on the whole repeating unit forming the dispersant, and it may be that a: 40 mol % to 50 mol %, b: 10 mol % to 20 mol %, c: 5 mol % to 10 mol %, d: 3 mol % to 6 mol %, e: 1 mol % to 5 mol %, f: 15 mol % to 20 mol % and g: 2 mol % to 6 mol %, however, a to g are not limited thereto.

The acrylic resin is not particularly limited as long as it is capable of exhibiting properties such as strength and developability of a film prepared with the resin composition.

As the acrylic resin, a copolymerized resin of a multifunctional monomer providing mechanical strength and a monomer providing alkali solubility may be used, and the binder resin may further include binders generally used in the art.

The multifunctional monomer providing mechanical strength of the film may be any one or more of unsaturated carboxylic acid esters; aromatic vinyls; unsaturated ethers; unsaturated imides; and acid anhydrides.

Specific examples of the unsaturated carboxylic acid esters may be selected from the group consisting of benzyl (meth)acrylate, methyl (meth)acrylate, ethyl (meth)acrylate, butyl (meth)acrylate, dimethylaminoethyl (meth)acrylate, isobutyl (meth)acrylate, t-butyl (meth)acrylate, cyclohexyl (meth)acrylate, isobornyl (meth)acrylate, ethylhexyl (meth)acrylate, 2-phenoxyethyl (meth)acrylate, tetrahydrofurfuryl (meth)acrylate, hydroxyethyl (meth)acrylate, 2-hydroxypropyl (meth)acrylate, 2-hydroxy-3-chloropropyl (meth)acrylate, 4-hydroxybutyl (meth)acrylate, acyloctyloxy-2-hydroxypropyl (meth)acrylate, glycerol (meth)acrylate, 2-methoxyethyl (meth)acrylate, 3-methoxybutyl (meth)acrylate, ethoxydiethylene glycol (meth)acrylate, methoxytriethylene glycol (meth)acrylate, methoxytripropylene glycol (meth)acrylate, poly(ethylene glycol) methyl ether (meth)acrylate, phenoxydiethylene glycol (meth)acrylate, p-nonylphenoxy polyethylene glycol (meth)acrylate, p-nonylphenoxy polypropylene glycol (meth)acrylate, glycidyl (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, tribromophenyl (meth)acrylate, methyl α-hydroxymethyl acrylate, ethyl α-hydroxymethyl acrylate, propyl α-hydroxymethyl acrylate and butyl α-hydroxymethyl acrylate, but are not limited thereto.

Specific examples of the aromatic vinyl monomers may be selected from the group consisting of styrene, α-methylstyrene, (o,m,p)-vinyl toluene, (o,m,p)-methoxystyrene and (o,m,p)-chlorostyrene, but are not limited thereto.

Specific examples of the unsaturated ethers may be selected from the group consisting of vinyl methyl ether, vinyl ethyl ether and allyl glycidyl ether, but are not limited thereto.

Specific examples of the unsaturated imides may be selected from the group consisting of N-phenylmaleimide, N-(4-chlorophenyl)maleimide, N-(4-hydroxyphenyl)maleimide and N-cyclohexylmaleimide, but are not limited thereto.

Examples of the acid anhydride may include maleic anhydride, methyl maleic anhydride, tetrahydrophthalic anhydride, and the like, but are not limited thereto.

The monomer providing alkali solubility is not particularly limited as long as it includes an acid group, and using one or more types selected from the group consisting of, for example, (meth)acrylic acid, crotonic acid, itaconic acid, maleic acid, fumaric acid, monomethyl maleic acid, 5-norbornene-2-carboxylic acid, mono-2-((meth)acryloyloxy) ethyl phthalate, mono-2-((meth)acryloyloxy)ethyl succinate and ω-carboxypolycarprolactone mono(meth)acrylate is preferred, however, the monomer is not limited thereto.

According to one embodiment of the present specification, the acrylic resin may have an acid value of 50 KOH mg/g to 130 KOH mg/g and a weight average molecular weight of 1,000 to 50,000.

In one embodiment of the present specification, the acrylic resin may be prepared by mixing benzyl (meth)acrylate, styrene, N-phenylmaleimide, (meth)acrylic acid, 3-mercaptopropionic acid that is a chain transfer agent, and acetic acid 3-methoxy ester that is a solvent.

In another embodiment of the present specification, the acrylic resin may be prepared by, after mixing benzyl (meth)acrylate, (meth)acrylic acid, 3-mercaptopropionic acid that is a chain transfer agent, and acetic acid 3-methoxy ester that is a solvent, further mixing tetrabutyl ammonium bromide and glycidyl (meth)acrylate thereto.

A content of the colorant composition comprising the first and the second xanthene-based dyes in the colorant dispersion may be from 5% by weight to 20% by weight. In the colorant dispersion, the acrylic resin may be included in 1% by weight to 60% by weight, the dispersant in 1% by weight to 40% by weight, and the solvent in 10% by weight to 90% by weight.

One embodiment of the present specification provides a photosensitive resin composition further including the colorant dispersion described above; a blue colorant dispersion; an acrylic resin; a multifunctional monomer; a surfactant; an initiator; and a solvent.

The blue colorant dispersion is prepared using PB 15:6 (BASF Corporation); a dispersant; an acrylic resin; a solvent;
and a bead. In addition, a triarylmethane dye may be used instead of PB 15:6 in the blue colorant dispersion.

According to another embodiment of the present disclosure, the colorant composition described above may further comprise one or more types of dyes and pigments. Examples of the dyes and the pigments further included are the same as the examples of the dyes and the pigments further included in the colorant dispersion described above. One type of the dyes and the pigments further included in the colorant composition may be included in 1 parts by weight to 50 parts by weight and preferably in 10 parts by weight to 40 parts by weight based on 100 parts by weight of the colorant composition.

As the acrylic resin, the solvent and the bead, those illustrated in the colorant dispersion described above may be used.

The multifunctional monomer is a monomer performing a role of forming a photoresist phase by light, and specifically, may be one type or a mixture of two or more types selected from the group consisting of propylene glycol methacrylate, dipentaerythritol hexaacrylate, dipentaerythritol acrylate, neopentyl glycol diacrylate, 6-hexanediol diacrylate, 1,6-hexanediol acrylate, tetraethylene glycol methacrylate, bisphenoxy ethyl alcohol diacrylate, trishydroxyethyl isocyanurate trimethacrylate, trimethylpropane trimethacrylate, diphenylpentaerythritol hexaacrylate, pentaerythritol trimethacrylate, pentaerythritol tetramethacrylate and dipentaerythritol hexamethacrylate.

The initiator is not particularly limited as long as it is an initiator generating radicals by light and prompting cross-linkage, and examples thereof may include one or more types selected from the group consisting of acetophenone-based compounds, biimidazole-based compounds, triazine-based compounds and oxime-based compounds.

Examples of the acetophenone-based compound may include 2-hydroxy-2-methyl-1-phenylpropan-1-one, 1-(4-isopropylphenyl)-2-hydroxy-2-methylpropan-1-one, 4-(2-hydroxyethoxy)-phenyl-(2-hydroxy-2-propyl)ketone, 1-hydroxycyclohexylphenyl ketone, benzoin methyl ether, benzoin ethyl ether, benzoin isobutyl ether, benzoin butyl ether, 2,2-dimethoxy-2-phenylacetophenone, 2-methyl-(4-methylthio)phenyl-2-morpholino-1-propan-1-one, 2-benzyl-2-dimethylamino-1-(4-morpholinophenyl)-butan-1-one, 2-(4-bromo-benzyl-2-dimethylamino-1-(4-morpholinophenyl)-butan-1-one, 2-methyl-1-[4-(methylthio)phenyl]-2-morpholinopropan-1-one or the like, but are not limited thereto.

Examples of the biimidazole-based compound may include 2,2-bis(2-chlorophenyl)-4,4',5,5'-tetraphenyl biimidazole, 2,2'-bis(o-chlorophenyl)-4,4',5,5'-tetrakis(3,4,5-trimethoxyphenyl)-1,2'-biimidazole, 2,2'-bis(2,3-dichlorophenyl)-4,4',5,5'-tetraphenyl biimidazole, 2,2'-bis(o-chlorophenyl)-4,4,5,5'-tetraphenyl-1,2'-biimidazole and the like, but are not limited thereto.

Examples of the triazine-based compound may include 3-{4-[2,4-bis(trichloromethyl)-s-triazin-6-yl]phenylthio}propionic acid, 1,1,1,3,3,3-hexafluoroisopropyl-3-{4-[2,4-bis(trichloromethyl)-s-triazin-6-yl]phenylthio}propionate, ethyl-2-{4-[2,4-bis(trichloromethyl)-s-triazin-6-yl]phenylthio}acetate, 2-epoxyethyl-2-{4-[2,4-bis(trichloromethyl)-s-triazin-6-yl]phenylthio}acetate, cyclohexyl-2-{4-[2,4-bis(trichloromethyl)-s-triazin-6-yl]phenylthio}acetate, benzyl-2-{4-[2,4-bis(trichloromethyl)-s-triazin-6-yl]phenylthio}acetate, 3-{chloro-4-[2,4-bis(trichloromethyl)-s-triazin-6-yl]phenylthio}propionic acid, 3-{4-[2,4-bis(trichloromethyl)-s-triazin-6-yl]phenylthio}propionamide, 2,4-bis(trichloromethyl)-6-p-methoxystyryl-s-triazine, 2,4-bis(trichloromethyl)-6-(1-p-dimethylaminophenyl)-1,3-butadienyl-s-triazine, 2-trichloromethyl-4-amino-6-p-methoxystyryl-s-triazine and the like, but are not limited thereto.

Examples of the oxime-based compound may include 1,2-octadione-1-(4-phenylthio)phenyl-2-(o-benzoyloxime) (Ciba-Geigy, CGI 124), ethanone-1-(9-ethyl)-6-(2-methylbenzoyl-3-yl)-1-(o-acetyloxime) (CGI 242), N-1919 (Adeka Corporation) and the like, but are not limited thereto.

According to one embodiment of the present specification, a change in the initial viscosity of the photosensitive resin composition and the viscosity measured after storing for 7 days in a 40° C. thermostat is from 2% to 2.5%, and a diameter of the dispersed average particle is from 40 nm to 100 nm.

According to one embodiment of the present specification, a content of the acrylic resin is from 1% by weight to 20% by weight, a content of the surfactant is from 0.1% by weight to 20% by weight and preferably from 0.1% by weight to 5% by weight, a content of the initiator is from 0.1% by weight to 20% by weight and preferably from 0.1% by weight to 5% by weight, and a content of the multifunctional monomer is from 0.1% by weight to 30% by weight and preferably from 1% by weight to 15% by weight, based on a total weight of the solid content in the photosensitive resin composition. A content of the solvent may be from 10% by weight to 85% by weight and preferably from 35% by weight to 65% by weight based on a total weight of the composition. The colorant dispersion may be included in 1% by weight to 20% by weight and preferably in 1% by weight to 10% by weight based on a total weight of the composition, and the blue colorant dispersion may be included in 1% by weight to 50% by weight based on a total weight of the composition. The first and the second xanthene-based dyes and the dispersant may be included in 5% by weight to 20% by weight in the colorant dispersion.

The total weight of the solid content means a sum of total weights of the components excluding the solvent in the resin composition. A standard of % by weight based on the solid content and the solid content of each component may be measured using general analysis means used in the art such as liquid chromatography or gas chromatography.

According to another embodiment of the present disclosure, the photosensitive resin composition described above may further comprise one or more types of dyes and pigments. Examples of the dyes and the pigments further included are the same as the examples of the dyes and the pigments further included in the colorant dispersion described above.

According to one embodiment of the present specification, the resin composition may further comprise an antioxidant.

According to one embodiment of the present specification, a content of the antioxidant is from 0.1% by weight to 20% by weight based on a total weight of the solid content in the resin composition.

The photosensitive resin composition may further comprise a surface additive. As the surface additive, a curing accelerator, an adhesion accelerator, a surfactant, a thermal polymerization inhibitor, an ultraviolet absorbent, a dispersant, a leveling agent, an antioxidant, a light crosslinking sensitizer, a multi-thiol agent and the like may be used. The surface additive may be included in approximately 0.1% by weight to 5% by weight, and preferably in approximately 0.5% by weight to 1% by weight based on a total amount of the photosensitive resin composition. A content of the surface additive may be from 0.1% by weight to 20% by weight based on a total weight of the solid content in the photosensitive resin composition.

As the light crosslinking sensitizer, one or more types selected from the group consisting of benzophenone-based compounds such as benzophenone, 4,4-bis(dimethylamino)benzophenone, 4,4-bis(diethylamino)benzophenone, 2,4,6-trimethylaminobenzophenone, methyl-o-benzoylbenzoate, 3,3-dimethyl-4-methoxybenzophenone and 3,3,4,4-tetra(t-butylperoxycarbonyl)benzophenone; fluorenone-based compounds such as 9-fluorenone, 2-chloro-9-fluorenone and 2-methyl-9-fluorenone; thioxanthone-based compounds such as thioxanthone, 2,4-diethylthioxanthone, 2-chlorothioxanthone, 1-chloro-4-propyloxythioxanthone, isopropylthioxanthone and diisopropylthioxanthone; xanthone-based compounds such as xanthone and 2-methylxanthone; anthraquinone-based compounds such as anthraquinone, 2-methylanthraquinone, 2-ethylanthraquinone, t-butylanthraquinone and 2,6-dichloro-9,10-anthraquinone; acridine-based compounds such as 9-phenylacridine, 1,7-bis(9-acridinyl)heptane, 1,5-bis(9-acridinylpentane) and 1,3-bis(9-acridinyl)propane; dicarbonyl compounds such as benzyl, 1,7,7-trimethyl-bicyclo[2,2,1]heptane-2,3-dione and 9,10-phenanthrenequinone; phosphine oxide-based compounds such as 2,4,6-trimethylbenzoyl diphenylphosphine oxide and bis(2,6-dimethoxybenzoyl)-2,4,4-trimethylpentyl phosphine oxide; benzoate-based compounds such as methyl-4-(dimethylamino)benzoate, ethyl-4-(dimethylamino)benzoate and 2-n-butoxyethyl-4-(dimethylamino)benzoate; amino synergists such as 2,5-bis(4-diethylaminobenzal)cyclopentanone, 2,6-bis(4-diethylaminobenzal)cyclohexanone and 2,6-bis(4-diethylaminobenzal)-4-methyl-cyclopentanone; coumarin-based compounds such as 3,3-carbonylvinyl-7-(diethylamino)coumarin, 3-(2-benzothiazolyl)-7-(diethylamino)coumarin, 3-benzoyl-7-(diethylamino)coumarin, 3-benzoyl-7-methoxy-coumarin and 10,10-carbonylbis[1,1,7,7-tetramethyl-2,3,6,7-tetrahydro-1H,5H,11H—C1]-benzopyrano[6,7,8-ij]-quinolizin-11-one; chalcone compounds such as 4-diethylamino chalcone and 4-azidebenzalacetophenone; 2-benzoylmethylene and 3-methyl-b-naphthothiazoline may be used.

The curing accelerator is used for enhancing curing and mechanical strength, and specifically, one or more types selected from the group consisting of 2-mercaptobenzimidazole, 2-mercaptobenzothiazole, 2-mercaptobenzoxazole, 2,5-dimercapto-1,3,4-thiadiazole, 2-mercapto-4,6-dimethylaminopyridine, pentaerythritol-tetrakis(3-mercaptopropionate), pentaerythritol-tris(3-mercaptopropionate), pentaerythritol-tetrakis(2-mercaptoacetate), pentaerythritol-tris(2-mercaptoacetate), trimethylolpropane-tris(2-mercaptoacetate) and trimethylolpropane-tris(3-mercaptopropionate) may be used.

As the adhesion accelerator used in the present specification, one or more types of methacryloyl silane coupling agents such as methacryloyloxy propyltrimethoxysilane, methacryloyloxy propyldimethoxysilane, methacryloyloxy propyltriethoxysilane and methacryloyloxy propyldimethoxysilane may be selected and used, and as alkyl trimethoxysilane, one or more types of octyltrimethoxysilane, dodecyltrimethoxysilane, octadecyltrimethoxysilane and the like may be selected and used.

The surfactant is a silicone-based surfactant or a fluorine-based surfactant, Specific examples of the silicone-based surfactant may include, as commercial products, DC3PA, DC7PA, SH11PA, SH21PA and SH8400 of Dow Corning Toray Silicone Co., Ltd.; and TSF-4440, TSF-4300, TSF-4445, TSF-4446, TSF-4460 or TSF-4452 of GE Toshiba Silicones Co., Ltd. Examples of the fluorine-based surfactant may include, as commercial products, F-470, F-471, F-475, F-482 or F-489 of DIC Corporation. In addition, as other usable commercial products, KP (Shin-Etsu Chemical Co., Ltd.), POLYFLOW (Kyoeisha Chemical Co., Ltd.), EFTOP (Tochem Products Co., Ltd.), MEGAFACE (DIC Corporation), Fluorad (Sumitomo 3M Limited), Asahi guard and Surflon (Asahi Glass Company), SOLSPERSE (Lubirzol Corporation), EFKA (BASF Corporation), PB 821 (Ajinomoto Fine-Techno Co., Inc.) or Disperbyk-series (BYK-Chemie) may be used, however, the surfactant is not limited thereto.

The antioxidant may include one or more types selected from the group consisting of hindered phenol antioxidants, amine-based antioxidants, thio-based antioxidants and phosphine-based antioxidants, but is not limited thereto.

Specific examples of the antioxidant may include phosphoric acid-based thermal stabilizers such as phosphoric acid, trimethylphosphate or triethylphosphate; hindered phenol-based primary antioxidants such as 2,6-di-t-butyl-p-cresole, octadecyl-3-(4-hydroxy-3,5-di-t-butylphenyl)propionate, tetrabis[methylene-3-(3,5-di-t-butyl-4-hydroxyphenyl)propionate]methane, 1,3,5-trimethyl-2,4,6-tris(3,5-di-t-butyl-4-hydroxybenzyl)benzene, 3,5-di-t-butyl-4-hydroxybenzylphosphite diethyl ester, 2,2-thiobis(4-methyl-6-t-butylphenol), 2,6-g,t-butylphenol, 4,4'-butylidene-bis(3-methyl-6-t-butylphenol), 4,4'-thiobis(3-methyl-6-t-butylphenol) or bis[3,3-bis-(4'-hydroxy-3'-tert-butylphenyl)butanoic acid]glycol ester; amine-based secondary antioxidants such as phenyl-α-naphthylamine, phenyl-β-naphthylamine, N,N'-diphenyl-p-phenylenediamine or N,N'-di-β-naphthyl-p-phenylenediamine; thio-based secondary antioxidants such as dilauryl disulfide, dilauryl thiopropionate, distearyl thiopropionate, mercaptobenzothiazole or tetramethylthiuram disulfide tetrabis[methylene-3-(laurylthio)propionate]methane; or phosphite-based secondary antioxidants such as triphenyl phosphite, tris(nonylphenyl)phosphite, triisodecyl phosphite, bis(2,4-dibutylphenyl) pentaerythritol diphosphate or (1,1'-biphenyl)-4,4'-diylbisphosphonous acid tetrakis[2,4-bis(1,1-dimethylethyl) phenyl]ester.

As the ultraviolet absorbent, 2-(3-t-butyl-5-methyl-2-hydroxyphenyl)-5-chloro-benzotriazole, alkoxy benzophenone and the like may be used, however, those generally used in the art may all be used without being limited thereto.

The thermal polymerization inhibitor may include one or more types selected from the group consisting of p-anisole, hydroquinone, pyrocatechol, t-butyl catechol, N-nitrosophenylhydroxyamine ammonium salts, N-nitrosophenylhydroxyamine aluminum salts, p-methoxyphenol, di-t-butyl-p-cresole, pyrogallol, benzoquinone, 4,4-thiobis(3-methyl-6-t-butylphenol), 2,2-methylenebis(4-methyl-6-t-butylphenol), 2-mercaptoimidazole and phenothiazine, but is not limited thereto, and may include those generally known in the art.

The leveling agent may be polymeric or non-polymeric. Specific examples of the polymeric leveling agent may include polyethyleneimine, polyamideamine, and reaction products of amine and epoxide, and specific examples of the non-polymeric leveling agent may include non-polymer sulfur-containing and non-polymer nitrogen-containing compounds, but are not limited thereto, and those generally used in the art may all be used.

One embodiment of the present specification provides a color filter provided with a transparent substrate and a colored layer provided on the transparent substrate, wherein the colored layer includes a cured material of the photosensitive resin composition.

The color filter may be manufactured using the resin composition. The color filter may be formed by forming a coating layer through coating the resin composition on the substrate, and then exposing, developing and curing the coating layer.

The coating method is not particularly limited, and a spray method, a roll coating method, a spin coating method and the like may be used, and generally, a spin coating method is widely used. In addition, after forming a coated film, some of the residual solvent may be removed under vacuum in some cases.

Examples of a light source for curing the resin composition according to the present specification include mercury vapor arc, carbon arc, Xe arc and the like releasing light in a wavelength of 250 nm to 450 nm, but are not limited thereto.

The resin composition according to one embodiment of the present specification has excellent heat resistance and experiences small color changes with heat treatment, and therefore, a color filter having high color gamut, and high luminance and contrast ratio may be provided even with a curing process in the manufacture of the color filter.

The substrate may be a glass plate, a silicon wafer, and a plate made of a plastic substrate such as polyethersulfone (PES) and polycarbonate (PC), and the type is not particularly limited.

The color filter may comprise a red pattern, a green pattern, a blue pattern and a black matrix.

According to another embodiment, the color filter may further comprise an overcoat layer.

With intent to enhance contrast, a grid black pattern referred to as a black matrix may be disposed between color pixels of the color filter. Chromium may be used as a material of the black matrix. In this case, a method of depositing chromium on a whole glass substrate and forming a pattern by etching treatment may be used. However, when considering high process costs, high reflectance of chromium, environmental contamination caused by chromium waste liquid, a resin black matrix using a pigment dispersion method capable of micromachining may be used.

The black matrix according to one embodiment of the present specification may use black pigments or black dyes as a colorant. For example, carbon black may be used alone, or carbon black and a coloring pigment may be mixed and used. Herein, since a coloring pigment lacking a lightproof property is mixed thereto, there is an advantage in that film strength or adhesion to a substrate does not decline even when the amount of the colorant relatively increases.

The colored layer of the color filter has a thickness of 0 μm to 5 μm. The thickness is preferably from 2.23 μm to 2.33 μm.

A liquid crystal display device comprising the color filter according to the present specification is provided. The liquid crystal display device may have constitutions known in the art except for comprising the color filter described above.

A color change (ΔEab) value of the liquid crystal display device is from 2.5 to 2.8. Having a smaller ΔEab value means having excellent color heat resistance.

Hereinafter, the present specification will be described in detail with reference to examples. However, the following examples are for illustrative purposes only, and the scope of the present specification includes the scope described in the appended claims, and substitutions and modifications thereof, and is not limited to the scope of the examples.

Preparation Example

1. Colorant Composition Comprising Colorant Micronized Through Micronizing Process (1) Colorant Composition 1

10 g of a first xanthene-based dye represented by the following chemical formula (Compound 1) and 1 g of a second xanthene-based dye represented by the following chemical formula (Compound 2) were introduced to 100 g of N-methyl-2-pyrrolidone (NMP), and after raising the temperature to 100° C., the result was stirred for 24 hours. After that, the stirred solution was cooled to room temperature. Then, 1000 g of ethyl acetate was further introduced thereto, and after further stirring the result for 30 minutes, precipitates were filtered under vacuum and washed. After that, the result was dried for 24 hours in a vacuum oven at 60° C. to prepare Colorant 1. The following structures were used as the first and the second xanthene-based dyes.

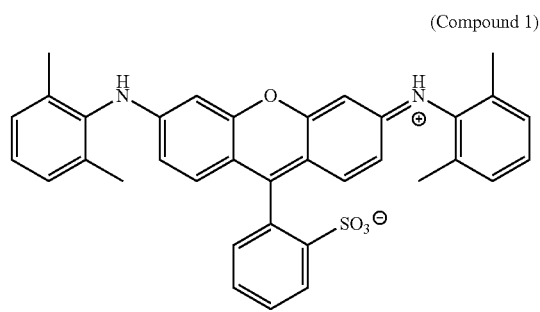

(Compound 1)

First Xanthene-Based Dye

-continued

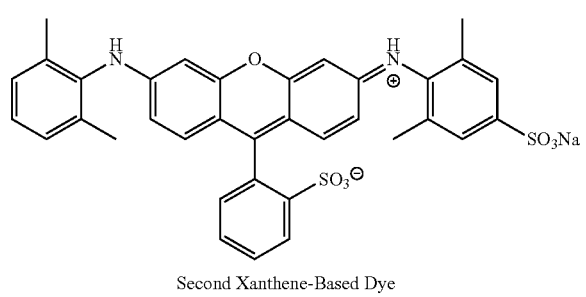

(Compound 2)

Second Xanthene-Based Dye

After placing 10 g of Colorant 1, 120 g of sodium chloride (NaCl) and 12 g of diethylene glycol in a stirrer (kneader), the result was stirred for 6 hours at 50° C. After introducing the stirred mixture to 1 L of 70° C. hot water, the result was stirred for 1 hour. After that, filtering and washing were repeated to removing residual sodium chloride (NaCl) and diethylene glycol, and the result was dried for 24 hours at 80° C. to obtain 9.5 g of Colorant Composition 1 including a micronized colorant.

(2) Colorant Composition 2

10 g of the first xanthene-based dye represented by the above-described chemical formula (Compound 1) and 1 g of the second xanthene-based dye represented by the above-described chemical formula (Compound 2) were introduced to 100 g of dimethylformamide (DMF), and after raising the temperature to 100° C., the result was stirred for 24 hours. After that, the stirred solution was cooled to room temperature. Then, 1000 g of diethyl ether was further introduced thereto, and after further stirring the result for 30 minutes, precipitates were filtered under vacuum and washed. After that, the result was dried for 24 hours in a vacuum oven at 60° C. to prepare Colorant 2.

After placing 10 g of Colorant 2, 120 g of sodium chloride (NaCl) and 12 g of diethylene glycol in a stirrer (kneader), the result was stirred for 6 hours at 50° C. After introducing the stirred mixture to 1 L of 70° C. hot water, the result was stirred for 1 hour. After that, filtering and washing were repeated to removing residual sodium chloride (NaCl) and diethylene glycol, and the result was dried for 24 hours at 80° C. to obtain 9.5 g of Colorant Composition 2 including a micronized colorant.

(3) Colorant Composition 3 without Solvent Treatment

After placing 10 g of the first xanthene-based dye represented by the above-described chemical formula (Compound 1), 120 g of sodium chloride (NaCl) and 12 g of diethylene glycol in a stirrer (kneader), the result was stirred for 6 hours at 50° C. After introducing the stirred mixture to 1 L of 70° C. hot water, the result was further stirred for 1 hour. After that, filtering and washing were repeated to removing residual sodium chloride (NaCl) and diethylene glycol, and the result was dried for 24 hours at 80° C. to obtain 9.5 g of Colorant Composition 3 including a micronized colorant.

(4) Colorant Composition 4

10 g of a first xanthene-based dye represented by the following chemical formula (Compound 1) and 1 g of a second xanthene-based dye represented by the following chemical formula (Compound 3) were introduced to 100 g of N-methyl-2-pyrrolidone (NMP), and after raising the temperature to 100° C., the result was stirred for 24 hours. After that, the stirred solution was cooled to room temperature. Then, 1000 g of ethyl acetate was further introduced thereto, and after further stirring the result for 30 minutes, precipitates were filtered under vacuum and washed. After that, the result was dried for 24 hours in a vacuum oven at 60° C. to prepare Colorant 4. The following structures were used as the first and the second xanthene-based dyes included in Colorant 4.

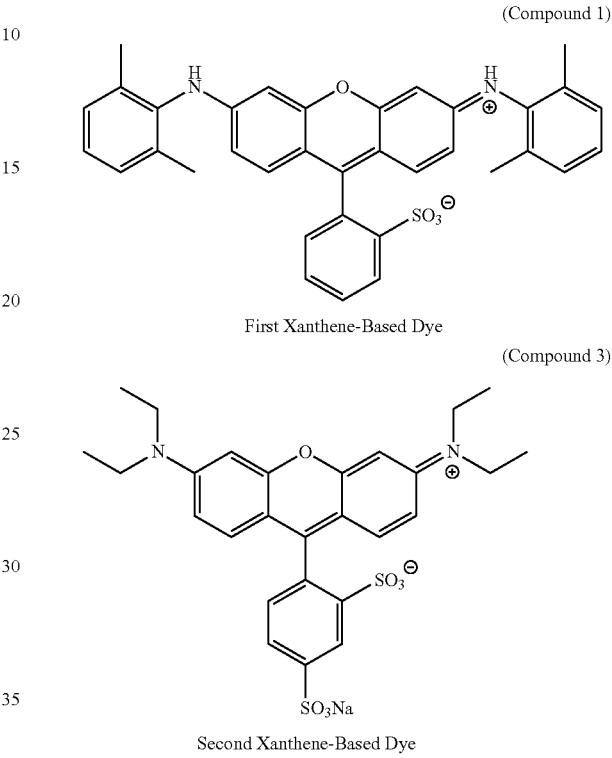

(Compound 1)

First Xanthene-Based Dye (Compound 3)

Second Xanthene-Based Dye

After placing 10 g of Colorant 4, 120 g of sodium chloride (NaCl) and 12 g of diethylene glycol in a stirrer (kneader), the result was stirred for 6 hours at 50° C. After introducing the stirred mixture to 1 L of 70° C. hot water, the result was stirred for 1 hour. After that, filtering and washing were repeated to removing residual sodium chloride (NaCl) and diethylene glycol, and the result was dried for 24 hours at 80° C. to obtain 9.2 g of Colorant Composition 4 including a micronized colorant.

(5) Colorant Composition 5

10 g of the first xanthene-based dye represented by the above-described chemical formula (Compound 1) and 1 g of the second xanthene-based dye represented by the above-described chemical formula (Compound 3) were introduced to 100 g of dimethylformamide (DMF), and after raising the temperature to 100° C., the result was stirred for 24 hours. After that, the stirred solution was cooled to room temperature. Then, 1000 g of diethyl ether was further introduced thereto, and after further stirring the result for 30 minutes, precipitates were filtered under vacuum and washed. After that, the result was dried for 24 hours in a vacuum oven at 60° C. to prepare Colorant 5.

After placing 10 g of Colorant 5, 120 g of sodium chloride (NaCl) and 12 g of diethylene glycol in a stirrer (kneader), the result was stirred for 6 hours at 50° C. After introducing the stirred mixture to 1 L of 70° C. hot water, the result was stirred for 1 hour. After that, filtering and washing were repeated to removing residual sodium chloride (NaCl) and diethylene glycol, and the result was dried for 24 hours at 80° C. to obtain 9.1 g of Colorant Composition 5 including a micronized colorant.

(6) Colorant Composition 6

Colorant Composition 6 was prepared in the same manner as with Colorant Composition 5 except that the second xanthene-based dye (Compound 3) of Colorant Composition 5 was changed to a second xanthene-based dye having the following structure (Compound 4).

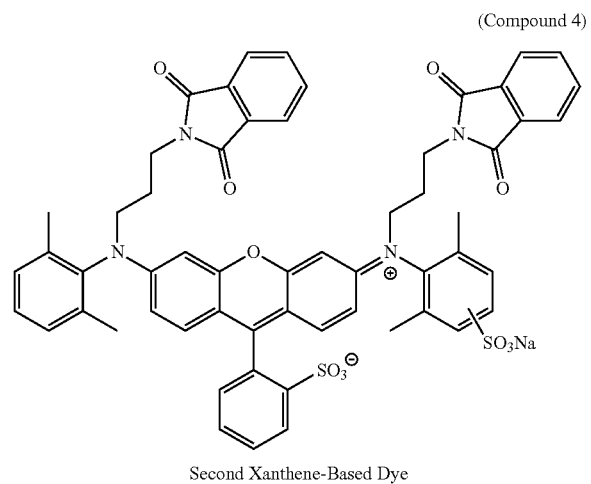

(Compound 4)

Second Xanthene-Based Dye (7) Colorant Composition 7

Colorant Composition 7 was prepared in the same manner as with Colorant Composition 5 except that the second xanthene-based dye (Compound 3) of Colorant Composition 5 was changed to a second xanthene-based dye having the following structure (Compound 5).

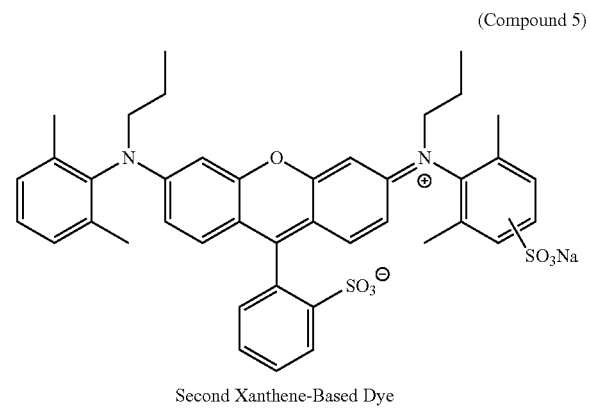

(Compound 5)

Second Xanthene-Based Dye

2. Preparation of Acrylic Resin (1) Acrylic Resin 1

28 g of benzyl (meth)acrylate, 5 g of N-phenylmaleimide, 3 g of styrene, 7 g of methacrylic acid, 0.3 g of 3-mercaptopropionic acid that is a charge transfer agent, and 137 g of acetic acid 3-methoxy ester that is a solvent were mixed for 30 minutes under nitrogen atmosphere using a mechanical stirrer.

Under nitrogen atmosphere, the reactor temperature was raised to 70° C., and when the temperature of the mixture reached 70° C., 1.3 g of AIBN that is a thermal polymerization initiator was introduced thereto, and the result was stirred for 15 hours to prepare Acrylic Resin 1 (Mw: 15,000 g/mol, Av: 100 mgKOH/g).

(2) Acrylic Resin 2

31 g of benzyl (meth)acrylate, 18 g of methacrylic acid, 0.3 g of 3-mercaptopropionic acid that is a charge transfer agent, and 137 g of acetic acid 3-methoxy ester that is a solvent were mixed for 30 minutes under nitrogen atmosphere using a mechanical stirrer.

Under nitrogen atmosphere, the reactor temperature was raised to 70° C., and when the temperature of the mixture reached 70° C., 1.3 g of AIBN that is a thermal polymerization initiator was introduced thereto, and the result was stirred for 15 hours. The temperature of the reactor polymerizing the polymer was raised to 80° C., 0.1 g of tetrabutylammonium bromide and 0.05 g of MEHQ that is a thermal polymerization inhibitor were introduced thereto, and after stirring the result for 30 minutes, 10 g of glycidyl (meth)acrylate was introduced to the polymer solution, and the result was further stirred for 12 hours at 120° C. to prepare Acrylic Resin 2 (Mw: 17,000 g/mol, Av: 70 mgKOH/g).

3. Preparation of Dispersion Resin 1

In a 4-neck separable flask provided with a thermometer, a stirrer, a distiller tube and a cooler, 56.7 parts by weight of propylene glycol monomethyl ether acetate based on a total weight of 100 parts by weight of a dispersant including a resin having a cationic group on the side chain was placed, and the temperature was raised to 75° C. under a nitrogen current. Based on a total weight of 100 parts by weight of a separately added monomer or polymerization initiator, 45.8 parts by weight of methyl methacrylate, 14.8 parts by weight of n-butyl methacrylate, 7.8 parts by weight of 2-ethylhexyl methacrylate, 5.0 parts by weight of benzyl methacrylate, 3.0 parts by weight of triethylene glycol methyl ether methacrylate, 18.9 parts by weight of 2-dimethylaminoethyl methacrylate, and 4.7 parts by weight of a benzyl chloride salt were homogenized and introduced to a dropping funnel, and, after attaching the dropping funnel to the 4-neck separable flask, dropped over 2 hours. After 2 hours from the completion of the dropping, it was identified from the solid content that the polymerization yield was 98.7% or higher and the weight average molecular weight (Mw) was 5,500 g/mol, and the result was cooled to 50° C. After that, 10.0 parts by weight of propylene glycol monomethyl ether based on a total weight of 100 parts by weight of the dispersant including a resin having a cationic group on the side chain was added thereto to prepare Dispersion Resin 1.

4. Preparation of Colorant Dispersion (1) Colorant Dispersion 1

7.6% by weight of Colorant Composition 1, 4% by weight of Dispersion Resin 1, 3% by weight of Acrylic Resin 1, and 85.4% by weight of propylene glycol monomethyl ether acetate were stirred, and, using a zirconia bead, Colorant Dispersion 1 was prepared.

(2) Colorant Dispersion 2

7.6% by weight of Colorant Composition 2, 4% by weight of Dispersion Resin 1, 3% by weight of Acrylic Resin 1, and 85.4% by weight of propylene glycol monomethyl ether acetate were stirred, and, using a zirconia bead, Colorant Dispersion 2 was prepared.

(3) Colorant Dispersion 3

7.6% by weight of Colorant Composition 3, 4% by weight of Dispersion Resin 1, 3% by weight of Acrylic Resin 1, and 85.4% by weight of propylene glycol monomethyl ether acetate were stirred, and, using a zirconia bead, Colorant Dispersion 3 was prepared.

(4) Colorant Dispersion 4

6.93% by weight of the second xanthene-based colorant represented by Chemical Formula 2, 4% by weight of Dispersion Resin 1, 3% by weight of Acrylic Resin 1, and 85.4% by weight of propylene glycol monomethyl ether acetate were stirred, and, using a zirconia bead, Colorant Dispersion 4 was prepared.

(5) Colorant Dispersion 5

6.93% by weight of Colorant Composition 3, 0.676% by weight of the second xanthene-based colorant represented by Chemical Formula 2, 4% by weight of Dispersion Resin 1, 3% by weight of Acrylic Resin 1, and 85.4% by weight of propylene glycol monomethyl ether acetate were stirred, and, using a zirconia bead, Colorant Dispersion 5 was prepared.

(6) Colorant Dispersion 6

Colorant Dispersion 6 was prepared in the same manner as with Colorant Dispersion 5 except that Colorant Composition 4 was used instead of Colorant Composition 3.

(7) Colorant Dispersion 7

Colorant Dispersion 7 was prepared in the same manner as with Colorant Dispersion 5 except that Colorant Composition 5 was used instead of Colorant Composition 3.

(8) Colorant Dispersion 8

Colorant Dispersion 8 was prepared in the same manner as with Colorant Dispersion 5 except that Colorant Composition 6 was used instead of Colorant Composition 3.

(9) Colorant Dispersion 9

Colorant Dispersion 9 was prepared in the same manner as with Colorant Dispersion 5 except that Colorant Composition 7 was used instead of Colorant Composition 3.

(10) Blue Colorant Dispersion

10% by weight of PB 15:6 (BASF Corporation), 5% by weight of Dispersion Resin 1, 4% by weight of Acrylic Resin 1, and 81% by weight of propylene glycol monomethyl ether acetate were stirred, and, using a zirconia bead, a blue colorant dispersion was prepared.

5. Preparation of Photosensitive Resin Composition (1) Photosensitive Resin Composition 1

6% by weight of Colorant Dispersion 1, 31.4% by weight of the blue colorant dispersion, 8% by weight of Acrylic Resin 2, 8% by weight of a multifunctional monomer (DPHA of Nippon Kayaku Co., Ltd.), 0.8% by weight of a surfactant (F-475 of DIC Corporation), 1.4% by weight of an initiator (BASF I-369), and 44.4% by weight of propylene glycol monomethyl ether acetate were stirred to obtain Photosensitive Resin Composition 1.

(2) Photosensitive Resin Composition 2

6% by weight of Colorant Dispersion 2, 31.4% by weight of the blue colorant dispersion, 8% by weight of Acrylic Resin 2, 8% by weight of a multifunctional monomer (DPHA of Nippon Kayaku Co., Ltd.), 0.8% by weight of a surfactant (F-475 of DIC Corporation), 1.4% by weight of an initiator (BASF I-369), and 44.4% by weight of propylene glycol monomethyl ether acetate were stirred to obtain Photosensitive Resin Composition 2.

(3) Photosensitive Resin Composition 3

6% by weight of Colorant Dispersion 3, 31.4% by weight of the blue colorant dispersion, 8% by weight of Acrylic Resin 2, 8% by weight of a multifunctional monomer (DPHA of Nippon Kayaku Co., Ltd.), 0.8% by weight of a surfactant (F-475 of DIC Corporation), 1.4% by weight of an initiator (BASF I-369), and 44.4% by weight of propylene glycol monomethyl ether acetate were stirred to obtain Photosensitive Resin Composition 3.

(4) Photosensitive Resin Composition 4

6% by weight of Colorant Dispersion 4, 31.4% by weight of the blue colorant dispersion, 8% by weight of Acrylic Resin 2, 8% by weight of a multifunctional monomer (DPHA of Nippon Kayaku Co., Ltd.), 0.8% by weight of a surfactant (F-475 of DIC Corporation), 1.4% by weight of an initiator (BASF I-369), and 44.4% by weight of propylene glycol monomethyl ether acetate were stirred to obtain Photosensitive Resin Composition 4.

(5) Photosensitive Resin Composition 5

6% by weight of Colorant Dispersion 5, 31.4% by weight of the blue colorant dispersion, 8% by weight of Acrylic Resin 2, 8% by weight of a multifunctional monomer (DPHA of Nippon Kayaku Co., Ltd.), 0.8% by weight of a surfactant (F-475 of DIC Corporation), 1.4% by weight of an initiator (BASF I-369), and 44.4% by weight of propylene glycol monomethyl ether acetate were stirred to obtain Photosensitive Resin Composition 5.

(6) Photosensitive Resin Composition 6

Photosensitive Resin Composition 6 was prepared in the same manner as with Photosensitive Resin Composition 4 except that Colorant Dispersion 6 was used instead of Colorant Dispersion 4.

(7) Photosensitive Resin Composition 7

Photosensitive Resin Composition 7 was prepared in the same manner as with Photosensitive Resin Composition 4 except that Colorant Dispersion 7 was used instead of Colorant Dispersion 4.

(8) Photosensitive Resin Composition 8

Photosensitive Resin Composition 8 was prepared in the same manner as with Photosensitive Resin Composition 4 except that Colorant Dispersion 8 was used instead of Colorant Dispersion 4.

(9) Photosensitive Resin Composition 9

Photosensitive Resin Composition 9 was prepared in the same manner as with Photosensitive Resin Composition 4 except that Colorant Dispersion 9 was used instead of Colorant Dispersion 4.

Example 1

1. Method of Evaluating Storage Stability

Initial viscosity (A) of Photosensitive Resin Composition 1 was measured at 25° C. on the day of the preparation, and viscosity after storing for 7 days in a 40° C. convection oven was measured at a revolution of 100 rpm using a viscometer (Toki Sangyo Viscometer TV-25). Changes in the viscosity over time was calculated based on the viscosity measured based on the following equation. Based on the calculated changes in the viscosity over time, storage stability was evaluated using the following criteria. Evaluation results are shown in the following Table 1.

(Changes in the viscosity over time)=[{(Initial viscosity)−(Viscosity over time)}/(Initial viscosity)]×100

◎: less than 5%, Δ: 5% to less than 10%, X: 10% or greater

2. Measurement on Particle Size of Dispersed Colorant

After filling approximately one quarter of a 1 cm×5 cm quartz cell with PGMEA, approximately 1 to 2 drops of the prepared colorant dispersion were dropped. The particle size was measured using a particle size analyzer (Malvern Panalytical Ltd. Zetasizer nano-ZS90). The results of measuring the particle size are shown in the following Table 1.

3. Method of Evaluating Transmittance

Photosensitive Resin Composition 1 was spin coated on glass (5 cm×5 cm), and prebaked for 100 seconds at 100° C. to form a film.

The distance between the film-formed substrate and a photomask was employed as 250 μm, and the whole surface of the substrate was irradiated with an exposure of 40 mJ/cm$^2$ using a stepper.

The exposed substrate was developed for 60 seconds in a developing solution (KOH, 0.05%), and post baked for 20 minutes at 230° C. to prepare a color pattern.

The color pattern was measured using a spectrophotometer (MCPD), and transmittance of Examples 1 and 2, and Comparative Examples 1 to 3 was obtained. The transmittance value is a value compared when By=0.050.

4. Method of Evaluating Heat Resistance

The substrate that was post-baked for 20 minutes at 230° C. and of which color properties were identified using a spectrophotometer was further heat treated for 5 hours and 30 minutes in a 230° C. convection oven, and color properties were identified again using a spectrophotometer to identify a ΔEab value.

$$\Delta Eab(L^*, a^*, b^*) = \sqrt{\{(\Delta L^*)^2 + (\Delta a^*)^2 + (\Delta b^*)^2\}}$$

Results of evaluating transmittance and heat resistance are shown in the following Table 2.

5. Measurement on Thickness of Color Filter Film

Using a thin film thickness measuring device (Alpha step), the thickness of the color filter film manufactured using Photosensitive Resin Composition 1 was measured, and the results are shown in the following Table 2.

Example 2

Experiments were conducted in the same manner as in Example except that Photosensitive Resin Composition 2 was used instead of Photosensitive Resin Composition 1.

Comparative Example 1

Experiments were conducted in the same manner as in Example except that Photosensitive Resin Composition 3 was used instead of Photosensitive Resin Composition 1.

Comparative Example 2

Experiments were conducted in the same manner as in Example except that Photosensitive Resin Composition 4 was used instead of Photosensitive Resin Composition 1.

Comparative Example 3

Experiments were conducted in the same manner as in Example except that Photosensitive Resin Composition 5 was used instead of Photosensitive Resin Composition 1.

TABLE 1

|  | Changes in Viscosity (%) | Results of Evaluating Storage Stability | Results of Measuring Particle Size of Dispersed Colorant (nm) |
|---|---|---|---|
| Example 1 | −2 | ◎ | 49 |
| Example 2 | −2.5 | ◎ | 46 |
| Comparative Example 1 | −7 | Δ | 60 |
| Comparative Example 2 | Unable to Measure (Gelation) | X | 55 |
| Comparative Example 3 | −6 | Δ | 58 |

In Table 1, gelation means a liquid becoming a semi-solid, and means a phenomenon in which a polymer forms a network structure by crosslinkage, and is not dissolved in a solvent thereby. According to the results of Table 1, changes in the viscosity of the photosensitive resin compositions of Examples 1 and 2 were from 2% to 2.5%, which are smaller than the changes in the viscosity of the photosensitive resin compositions of Comparative Examples 1 to 3 in the absolute value, and it was seen that storage stability was excellent.

In addition, diameters of the colorant particles of Examples 1 and 2 were smaller than diameters of the colorant particles of Comparative Examples 1 to 3, and it was seen that dispersibility of the dyes was enhanced.

Additionally conducted Example 3 was conducted in the same manner as in Example 1 except that Photosensitive Resin Composition 6 was used instead of Photosensitive Resin Composition 1, Example 4 was conducted in the same manner as in Example 1 except that Photosensitive Resin Composition 7 was used instead of Photosensitive Resin Composition 1, Example 5 was conducted in the same manner as in Example 1 except that Photosensitive Resin Composition 8 was used instead of Photosensitive Resin Composition 1, and Example 6 was conducted in the same manner as in Example 1 except that Photosensitive Resin Composition 9 was used instead of Photosensitive Resin Composition 1. As a result, Examples 3 to 6 had smaller changes in the viscosity compared to Comparative Examples 1 to 3, and results expressed by ◎ were obtained in the storage stability evaluation results as in Examples 1 and 2, and it was identified that Examples 3 to 6 had excellent storage stability compared to Comparative Examples 1 to 3.

TABLE 2

|  | Color Coordinate | | Transmittance | Heat Resistance (ΔEab) | Film Thickness (μm) |
|---|---|---|---|---|---|
|  | Bx | By | | | |
| Example 1 | 0.1471 | 0.050 | 4.98 | 2.8 | 2.33 |
| Example 2 | 0.1475 | 0.050 | 5.00 | 2.5 | 2.23 |
| Comparative Example 1 | 0.1469 | 0.050 | 4.92 | 3.2 | 2.35 |
| Comparative Example 2 | 0.1467 | 0.050 | 4.77 | 4.1 | 2.39 |
| Comparative Example 3 | 0.1470 | 0.050 | 4.95 | 3.7 | 2.41 |

As for heat resistance (ΔEab) of Table 2, having a small ΔEab value means having excellent heat resistance. According to the results of Table 2, it was seen that Examples 1 and 2 had enhanced transmittance compared to Comparative Examples 1 to 3. In addition, Examples 1 and 2 had a smaller ΔEab value compared to Comparative Examples 1 to 3, and it was identified that heat resistance was excellent. Moreover, the measured film thicknesses of Examples 1 and 2 were smaller than the thicknesses of Comparative Examples 1 to 3, and it was identified that high color gamut was able to be obtained using a relatively small amount of colorant.

In addition, it was identified that additionally conducted Examples 3 to 6 had higher transmittance and lower film thickness compared to Comparative Examples 1 to 3.

Hereinbefore, preferred embodiments of the present disclosure have been described, however, the present disclosure is not limited thereto, and various modifications may be made within the scope of the attached claims and the scope of detailed descriptions of the disclosure, and these also fall within the category of the disclosure.

The invention claimed is:

1. A method for preparing a colorant composition comprising:
    dissolving a first xanthene-based dye having the same number of positive charges and negative charges and a second xanthene-based dye having more negative charges than positive charges by one or more in a first solvent; and
    precipitating the dissolved first xanthene-based dye and the dissolved second xanthene-based dye in a second solvent.

2. The method for preparing a colorant composition of claim 1, further comprising micronizing the precipitated first xanthene-based dye and the precipitated second xanthene-based dye.

3. A colorant composition prepared using the preparation method of claim 2.

4. A colorant dispersion comprising:
    the colorant composition of claim 3;
    a dispersant;
    an acrylic resin; and
    a solvent.

5. The colorant dispersion of claim 4, wherein the first xanthene-based dye has π-π interactions with the second xanthene-based dye, and the second xanthene-based dye forms ionic bonds with the dispersant.

6. The colorant dispersion of claim 4, wherein diameters of dispersed particles of the colorant composition are from 40 nm to 80 nm, and viscosity of the colorant dispersion is from 2.5 cP to 6.5 cP.

7. A photosensitive resin composition comprising:
    the colorant dispersion of claim 4;
    a blue colorant dispersion;
    an acrylic resin;
    a multifunctional monomer;
    a surfactant;
    an initiator; and
    a solvent.

8. The photosensitive resin composition of claim 7, further comprising one or more pigments or dyes selected from the group consisting of phthalocyanine-based pigments or dyes, triarylmethane-based pigments or dyes, quinophthalone-based pigments or dyes, isoindoline-based pigments or dyes, and azo-based pigments or dyes.

9. The photosensitive resin composition of claim 7, wherein a change in initial viscosity of the photosensitive resin composition and viscosity measured after storing for 7 days in a 40° C. thermostat is from 2% to 2.5%, and a diameter of the dispersed average particle is 100 nm or less.

10. A color filter comprising:
    a transparent substrate; and
    a colored layer provided on the transparent substrate,
    wherein the colored layer comprises a cured material of the photosensitive resin composition of claim 7.

11. A liquid crystal display device comprising the color filter of claim 10.

12. The method for preparing a colorant composition of claim 1, wherein the first xanthene-based dye has a maximum absorption wavelength between 500 nm to 580 nm, and a difference between the maximum absorption wavelength of the first xanthene-based dye and a maximum absorption wavelength of the second xanthene-based dye is 100 nm or less.

13. The method for preparing a colorant composition of claim 1, wherein the first xanthene-based dye comprises a dye represented by the following Chemical Formula 1 and having the same number of positive charges and negative charges, and the second xanthene-based dye comprises a dye represented by the following Chemical Formula 2 and having more negative charges than positive charges by one or more:

[Chemical Formula 1]

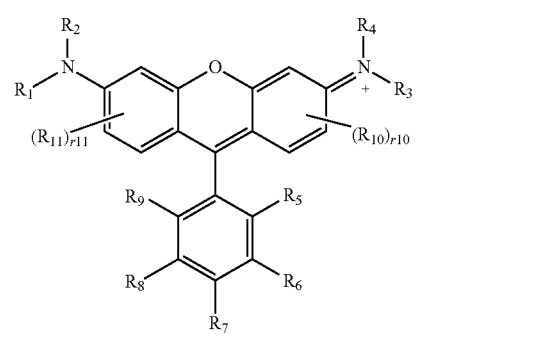

in Chemical Formula 1, $R_1$ to $R_4$ are the same as or different from each other, and each independently selected from the group consisting of hydrogen; deuterium; an anionic group; a hydroxyl group; a sulfonamide group; a sulfonate group; a substituted or unsubstituted alkyl group; a substituted or unsubstituted aryl group; a substituted or unsubstituted heteroaryl group; and a dianhydride group including a nitrogen atom;

$R_5$ to $R_9$ are the same as or different from each other, and each independently selected from the group consisting of hydrogen; deuterium; an anionic group; a hydroxyl group; a sulfonamide group; a sulfonate group; a substituted or unsubstituted alkyl group; a substituted or unsubstituted aryl group; and a substituted or unsubstituted heteroaryl group, but at least one of $R_5$ to $R_9$ is an anionic group; a sulfonate group; or a sulfonamide group; and $R_{10}$ and $R_{11}$ are the same as or different from each other, and each independently hydrogen; deuterium; a halogen group; a nitro group; or a substituted or unsubstituted alkyl group, $r_{10}$ and $r_{11}$ are each an integer of 0 to 3, and when $r_{10}$ and $r_{11}$ are each 2 or greater, structures in the parentheses are the same as or different from each other,

[Chemical Formula 2]

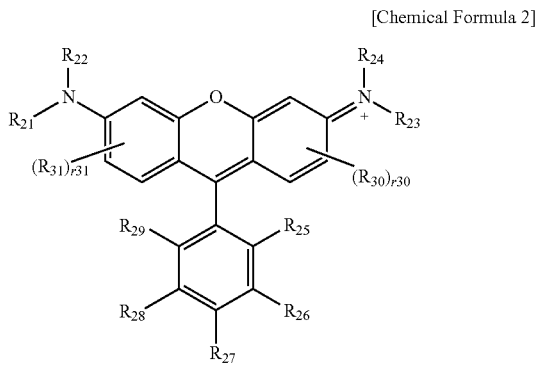

in Chemical Formula 2, $R_{21}$ to $R_{24}$ are the same as or different from each other, and each independently selected from the group consisting of hydrogen; deuterium; an anionic group; a hydroxyl group; a sulfonamide group; a sulfonate group; a substituted or unsubstituted alkyl group; a substituted or unsubstituted aryl group; a substituted or unsubstituted heteroaryl group; and a dianhydride group including a nitrogen atom, at least one of $R_{21}$ to $R_{24}$ is an alkyl group unsubstituted or substituted with an anionic group, a sulfonate group or a sulfonamide group; an aryl group substituted with an anionic group, a sulfonate group or a sulfonamide group; or a heteroaryl group substituted with an anionic group, a sulfonate group or a sulfonamide group;

$R_{25}$ to $R_{29}$ are the same as or different from each other, and each independently selected from the group consisting of hydrogen; deuterium; an anionic group; a hydroxyl group; a sulfonamide group; a sulfonate group; a substituted or unsubstituted linear or branched alkyl group having 1 to 30 carbon atoms; a substituted or unsubstituted aryl group; and a substituted or unsubstituted heteroaryl group, but at least one of $R_{25}$ to $R_{29}$ is an anionic group; a sulfonate group; or a sulfonamide group; and $R_{30}$ and $R_{31}$ are the same as or different from each other, and each independently hydrogen; deuterium; a halogen group; a nitro group; or a substituted or unsubstituted alkyl group, $r_{30}$ and $r_{31}$ are each an integer of 0 to 3, and when $r_{30}$ and $r_{31}$ are each 2 or greater, structures in the parentheses are the same as or different from each other.

14. The method for preparing a colorant composition of claim 1, wherein the first xanthene-based dye comprises a dye represented by the following Chemical Formula 3 and having the same number of positive charges and negative charges, and the second xanthene-based dye comprises a dye represented by the following Chemical Formula 4 and having more negative charges than positive charges by one or more:

[Chemical Formula 3]

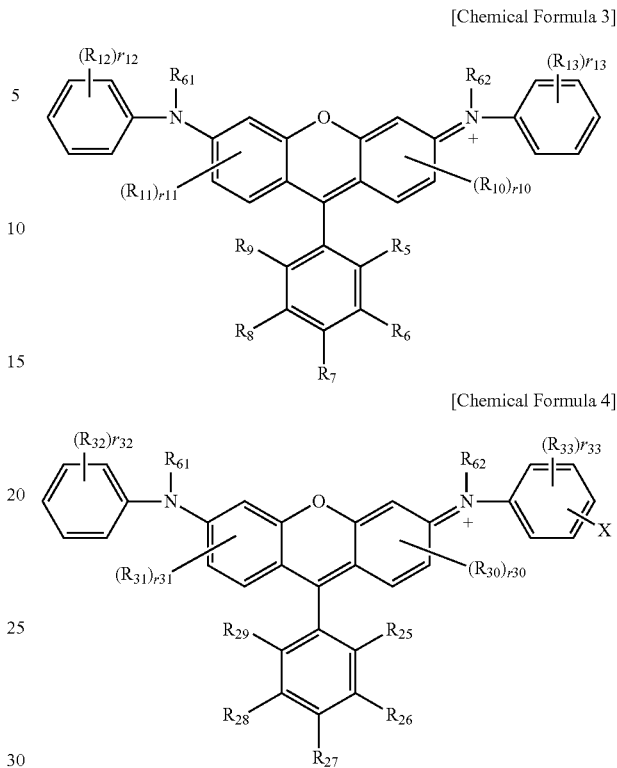

[Chemical Formula 4]

in Chemical Formulae 3 and 4, $R_{12}$, $R_{13}$, $R_{32}$ and $R_{33}$ are the same as or different from each other, and each independently hydrogen; deuterium; a halogen group; a nitro group; a substituted or unsubstituted alkyl group; an anionic group; a sulfonate group; or a sulfonamide group, $r_{12}$ and $r_{13}$ are each an integer of 0 to 5, $r_{32}$ is from 0 to 5, $r_{33}$ is an integer of 0 to 4, and when $r_{12}$, $r_{13}$, $r_{32}$ and $r_{33}$ are each 2 or greater, structures in the parentheses are the same as or different from each other;

$R_{61}$ and $R_{62}$ are the same as or different from each other, and each independently hydrogen; deuterium; a substituted or unsubstituted alkyl group; or a dianhydride group including a nitrogen atom;

X is an anionic group; a sulfonate group; or a sulfonamide group; and $R_5$ to $R_9$ are the same as or different from each other, and each independently selected from the group consisting of hydrogen; deuterium; an anionic group; a hydroxyl group; a sulfonamide group; a sulfonate group; a substituted or unsubstituted alkyl group; a substituted or unsubstituted aryl group; and a substituted or unsubstituted heteroaryl group, but at least one of R5 to R9 is an anionic group; a sulfonate group; or a sulfonamide group; and $R_{10}$ and $R_{11}$ are the same as or different from each other, and each independently hydrogen; deuterium; a halogen group; a nitro group; or a substituted or unsubstituted alkyl group, $r_{10}$ and $r_{11}$ are each an integer of 0 to 3, and when $r_{10}$ and $r_{11}$ are each 2 or greater, structures in the parentheses are the same as or different from each other, $R_{25}$ to $R_{29}$ are the same as or different from each other, and each independently selected from the group consisting of hydrogen; deuterium; an anionic group; a hydroxyl group; a sulfonamide group; a sulfonate group; a substituted or unsubstituted linear or branched alkyl group having 1 to 30 carbon atoms; a substituted or unsubstituted aryl group; and a substituted or unsubstituted heteroaryl group, but at least one of $R_{25}$ to $R_{29}$ is an anionic group; a sulfonate group; or a sulfonamide group; and $R_{30}$ and $R_{31}$ are the same as or different from each other, and each independently hydrogen; deuterium; a halogen group; a nitro group; or a substituted or unsubstituted alkyl group, $r_{30}$ and $r_{31}$ are each an integer of 0 to 3, and when $r_{30}$ and $r_{31}$ are each 2 or greater, structures in the parentheses are the same as or different from each other.

15. The method for preparing a colorant composition of claim 1, wherein solubility of the first solvent for the first xanthene-based dye and the second xanthene-based dye is from 0.2% by mass to 50% by mass, and solubility of the second solvent for the first xanthene-based dye and the second xanthene-based dye is from 0.000001% by mass to 0.02% by mass.

16. The method for preparing a colorant composition of claim 1, wherein the first solvent comprises a sulfoxide compound or an amide compound.

17. The method for preparing a colorant composition of claim 1, wherein the second solvent comprises at least one selected from the group consisting of water, hydrochloric acid, sodium hydroxide, alcohol compounds, ketone compounds, ether compounds, aromatic compounds, carbon disulfide, aliphatic compounds, nitrile compounds, halogen compounds, ester compounds and ionic liquids.

18. The method for preparing a colorant composition of claim 1, wherein a dispersant comprising a monomer or a polymer comprising an amine structure or an ammonium structure is added in the precipitating step.

19. The method for preparing a colorant composition of claim 1, wherein the second xanthene-based dye further comprises a counter cation.

20. The method for preparing a colorant composition of claim 18, wherein the dispersant further comprises a counter anion.

* * * * *